United States Patent
Graumann et al.

(10) Patent No.: US 10,236,915 B2
(45) Date of Patent: Mar. 19, 2019

(54) VARIABLE T BCH ENCODING

(71) Applicant: Microsemi Solutions (U.S.), Inc., Aliso Viejo, CA (US)

(72) Inventors: Peter John Waldemar Graumann, Calgary (CA); Saeed Fouladi Fard, Calgary (CA)

(73) Assignee: Microsemi Solutions (U.S.), Inc., Chandler, AZ (US)

( * ) Notice: Subject to any disclaimer, the term of this patent is extended or adjusted under 35 U.S.C. 154(b) by 0 days.

(21) Appl. No.: 15/657,020

(22) Filed: Jul. 21, 2017

(65) Prior Publication Data

US 2018/0034483 A1 Feb. 1, 2018

Related U.S. Application Data

(60) Provisional application No. 62/368,491, filed on Jul. 29, 2016.

(51) Int. Cl.
*H03M 13/00* (2006.01)
*H03M 13/35* (2006.01)
(Continued)

(52) U.S. Cl.
CPC ....... *H03M 13/353* (2013.01); *G06F 11/1068* (2013.01); *H03M 13/152* (2013.01);
(Continued)

(58) Field of Classification Search
CPC .. H03M 13/353; H03M 13/152; H03M 13/35; H03M 13/6356; H03M 13/6516; G06F 11/1068
See application file for complete search history.

(56) References Cited

U.S. PATENT DOCUMENTS 815,137 A 3/1906 Beecher
4,852,098 A * 7/1989 Brechard ................ G06F 7/724
714/782
(Continued)

OTHER PUBLICATIONS

NVM Express, revision 1.0; Intel Corporation;, Jul. 12, 2011, pp. 103-106 and 110-114.
(Continued)

*Primary Examiner* — Esaw T Abraham
(74) *Attorney, Agent, or Firm* — Glass and Associates; Kenneth Glass

(57) ABSTRACT

A system for implementing variable T BCH encoders includes: a polynomial multiplier for multiplying a message polynomial by a difference polynomial to achieve a first value, wherein the message polynomial comprises data bits as coefficients and the difference polynomial comprises minimal polynomials that are present in a T error correcting code and are absent from a T-ΔT error correcting BCH code; a shifter/zero-padder coupled with the BCH encoder, the shifter/zero-padder for multiplying the first value by $x^{N-\tilde{K}}$ to achieve a second value; a BCH encoder coupled with the polynomial multiplier, the BCH encoder for dividing the second value by a generator polynomial of the T error correcting BCH code and calculating a remainder based on the dividing to achieve a third value; and a polynomial divider for dividing the third value by the difference polynomial to achieve a fourth value comprising parity of the T-ΔT error correcting BCH code.

25 Claims, 16 Drawing Sheets

(51) Int. Cl.
*H03M 13/15* (2006.01)
*G06F 11/10* (2006.01)

(52) U.S. Cl.
CPC ....... *H03M 13/35* (2013.01); *H03M 13/6356* (2013.01); *H03M 13/6516* (2013.01)

(56) References Cited

U.S. PATENT DOCUMENTS

| | | | |
|---|---|---|---|
| 5,615,235 A | 3/1997 | Kakuishi et al. | |
| 5,732,092 A | 3/1998 | Shinohara | |
| 5,822,244 A | 10/1998 | Hansen et al. | |
| 5,875,343 A | 2/1999 | Binford et al. | |
| 5,999,959 A * | 12/1999 | Weng | G06F 7/724 708/492 |
| 6,115,788 A | 9/2000 | Thowe | |
| 6,148,360 A | 11/2000 | Leak et al. | |
| 6,279,137 B1 * | 8/2001 | Poeppelman | H03M 13/1515 714/781 |
| 6,412,041 B1 | 6/2002 | Lee et al. | |
| 6,539,515 B1 | 3/2003 | Gong | |
| 6,567,313 B2 | 5/2003 | Tanaka et al. | |
| 6,633,856 B2 | 10/2003 | Richardson et al. | |
| 6,725,409 B1 | 4/2004 | Wolf | |
| 6,789,227 B2 | 9/2004 | De Souza et al. | |
| 6,871,168 B1 | 3/2005 | Tanaka et al. | |
| 6,895,547 B2 | 5/2005 | Eleftheriou et al. | |
| 6,934,804 B2 | 8/2005 | Hashemi | |
| 6,963,507 B2 | 11/2005 | Tanaka et al. | |
| 6,976,194 B2 | 12/2005 | Cypher | |
| 6,976,197 B2 | 12/2005 | Faust et al. | |
| 6,990,624 B2 * | 1/2006 | Dohmen | H03M 13/1535 714/782 |
| 7,032,081 B1 | 4/2006 | Gefen et al. | |
| 7,050,334 B2 | 5/2006 | Kim et al. | |
| 7,116,732 B2 | 10/2006 | Worm et al. | |
| 7,206,992 B2 | 4/2007 | Xin | |
| 7,209,527 B2 | 4/2007 | Smith et al. | |
| 7,237,183 B2 | 6/2007 | Xin | |
| 7,324,559 B2 | 1/2008 | McGibney | |
| 7,376,015 B2 | 5/2008 | Tanaka et al. | |
| 7,450,668 B2 | 11/2008 | Ghosh et al. | |
| 7,457,906 B2 | 11/2008 | Pettey et al. | |
| 7,472,331 B2 | 12/2008 | Kim et al. | |
| 7,484,158 B2 | 1/2009 | Sharon et al. | |
| 7,529,215 B2 | 5/2009 | Osterling | |
| 7,567,472 B2 | 7/2009 | Gatzemeier et al. | |
| 7,620,784 B2 | 11/2009 | Panabaker et al. | |
| 7,650,480 B2 | 1/2010 | Jiang et al. | |
| 7,694,047 B1 | 4/2010 | Alston | |
| 7,708,195 B2 | 5/2010 | Yoshida et al. | |
| 7,739,472 B2 | 6/2010 | Guterman et al. | |
| 7,752,346 B2 | 7/2010 | Talayco et al. | |
| 7,801,233 B1 | 9/2010 | Chow et al. | |
| 7,860,930 B2 | 12/2010 | Freimuth et al. | |
| 7,904,793 B2 | 3/2011 | Mokhlesi et al. | |
| 7,930,623 B2 | 4/2011 | Pisek et al. | |
| 7,937,641 B2 | 5/2011 | Amidi | |
| 7,945,721 B1 | 5/2011 | Johnsen et al. | |
| 7,958,430 B1 | 6/2011 | Kolokowsky et al. | |
| 7,975,193 B2 | 7/2011 | Johnson | |
| 8,094,508 B2 | 1/2012 | Gatzemeier et al. | |
| 8,140,930 B1 | 3/2012 | Maru | |
| 8,176,367 B2 | 5/2012 | Dreifus et al. | |
| 8,219,894 B2 | 7/2012 | Au et al. | |
| 8,223,745 B2 | 7/2012 | Johnsen et al. | |
| 8,228,728 B1 | 7/2012 | Yang et al. | |
| 8,244,946 B2 | 8/2012 | Gupta et al. | |
| 8,245,112 B2 | 8/2012 | Hicken et al. | |
| 8,245,117 B1 | 8/2012 | Wu | |
| 8,250,286 B2 | 8/2012 | Yeh et al. | |
| 8,254,112 B2 | 8/2012 | Yang et al. | |
| 8,255,770 B2 | 8/2012 | Park et al. | |
| 8,259,498 B2 | 9/2012 | Yogev et al. | |
| 8,259,506 B1 | 9/2012 | Sommer et al. | |
| 8,261,136 B2 | 9/2012 | D'Abreu et al. | |
| 8,281,217 B2 | 10/2012 | Kim et al. | |
| 8,281,227 B2 | 10/2012 | Inskeep et al. | |
| 8,286,004 B2 | 10/2012 | Williams | |
| 8,307,258 B2 | 11/2012 | Flynn et al. | |
| 8,327,220 B2 | 12/2012 | Borchers et al. | |
| 8,335,977 B2 | 12/2012 | Weingarten et al. | |
| 8,341,502 B2 | 12/2012 | Steiner et al. | |
| 8,351,258 B1 | 1/2013 | Yang et al. | |
| 8,359,522 B2 | 1/2013 | Gunnam et al. | |
| 8,392,789 B2 | 3/2013 | Biscondi et al. | |
| 8,402,201 B2 | 3/2013 | Strasser et al. | |
| 8,418,023 B2 | 4/2013 | Gunnam et al. | |
| 8,429,325 B1 | 4/2013 | Onufryk et al. | |
| 8,429,497 B2 | 4/2013 | Tu et al. | |
| 8,464,141 B2 * | 6/2013 | Pilsl | H03M 13/152 714/782 |
| 8,473,812 B2 | 6/2013 | Ramamoorthy et al. | |
| 8,493,791 B2 | 7/2013 | Karakulak et al. | |
| 8,504,885 B2 | 8/2013 | Haratsch et al. | |
| 8,504,887 B1 | 8/2013 | Varnica et al. | |
| 8,555,140 B2 | 10/2013 | Gunnam et al. | |
| 8,621,318 B1 | 12/2013 | Micheloni et al. | |
| 8,638,602 B1 | 1/2014 | Horn et al. | |
| 8,640,005 B2 | 1/2014 | Wilkerson et al. | |
| 8,645,613 B2 | 2/2014 | Tan et al. | |
| 8,656,257 B1 | 2/2014 | Micheloni et al. | |
| 8,665,648 B2 | 3/2014 | Mun et al. | |
| 8,694,849 B1 | 4/2014 | Micheloni et al. | |
| 8,694,855 B1 | 4/2014 | Micheloni et al. | |
| 8,706,956 B2 | 4/2014 | Cagno et al. | |
| 8,707,122 B1 | 4/2014 | Micheloni et al. | |
| 8,737,141 B2 | 5/2014 | Melik-Martirosian | |
| 8,739,008 B2 | 5/2014 | Liu et al. | |
| 8,755,229 B1 | 6/2014 | Visconti et al. | |
| 8,762,620 B2 | 6/2014 | Prins et al. | |
| 8,769,374 B2 | 7/2014 | Franceschini et al. | |
| 8,775,913 B2 | 7/2014 | Haratsch et al. | |
| 8,787,428 B2 | 7/2014 | Dai et al. | |
| 8,812,940 B2 * | 8/2014 | Pilsl | H03M 13/152 714/758 |
| 8,856,622 B2 | 10/2014 | Ramamoorthy et al. | |
| 8,898,372 B2 | 11/2014 | Yeh | |
| 8,917,734 B1 | 12/2014 | Brown | |
| 8,924,824 B1 | 12/2014 | Lu | |
| 8,953,373 B1 | 2/2015 | Haratsch et al. | |
| 8,958,247 B2 | 2/2015 | Asaoka et al. | |
| 8,959,280 B2 | 2/2015 | Ma et al. | |
| 8,984,216 B2 | 3/2015 | Fillingim | |
| 8,995,197 B1 | 3/2015 | Steiner et al. | |
| 8,995,302 B1 | 3/2015 | Brown et al. | |
| 9,025,495 B1 | 5/2015 | Onufryk et al. | |
| 9,058,289 B2 | 6/2015 | Tai et al. | |
| 9,142,314 B2 | 9/2015 | Beltrami et al. | |
| 9,164,891 B2 | 10/2015 | Karamcheti et al. | |
| 9,244,763 B1 | 1/2016 | Kankani et al. | |
| 9,251,909 B1 | 2/2016 | Camp et al. | |
| 9,257,182 B2 | 2/2016 | Grunzke | |
| 9,268,531 B1 | 2/2016 | Son et al. | |
| 9,287,898 B2 * | 3/2016 | Yen | H03M 13/1545 |
| 9,292,428 B2 | 3/2016 | Kanamori et al. | |
| 9,294,132 B1 | 3/2016 | Peleato-Inarrea | |
| 9,397,701 B1 | 7/2016 | Micheloni et al. | |
| 9,444,655 B2 | 9/2016 | Sverdlov et al. | |
| 9,590,656 B2 | 3/2017 | Micheloni et al. | |
| 9,787,327 B2 * | 10/2017 | Zhang | H03M 13/1545 |
| 9,916,906 B2 | 3/2018 | Wu et al. | |
| 2002/0051501 A1 | 5/2002 | Demjanenko et al. | |
| 2002/0129308 A1 | 9/2002 | Kinoshita et al. | |
| 2002/0181438 A1 | 12/2002 | McGibney | |
| 2003/0033567 A1 | 2/2003 | Tamura et al. | |
| 2003/0104788 A1 | 6/2003 | Kim | |
| 2003/0225970 A1 | 12/2003 | Hashemi | |
| 2004/0088636 A1 | 5/2004 | Cypher | |
| 2004/0123230 A1 | 6/2004 | Lee et al. | |
| 2004/0136236 A1 | 7/2004 | Cohen et al. | |
| 2004/0153902 A1 * | 8/2004 | Machado | G06F 11/1068 714/710 |
| 2004/0181735 A1 | 9/2004 | Xin | |
| 2004/0234150 A1 | 11/2004 | Chang | |

(56) References Cited

U.S. PATENT DOCUMENTS

| | | |
|---|---|---|
| 2004/0252791 A1 | 12/2004 | Shen et al. |
| 2004/0268015 A1 | 12/2004 | Pettey et al. |
| 2005/0010846 A1 | 1/2005 | Kikuchi et al. |
| 2005/0226355 A1 | 10/2005 | Kibune et al. |
| 2005/0248999 A1 | 11/2005 | Tamura et al. |
| 2005/0252791 A1 | 11/2005 | Pechtold et al. |
| 2005/0286511 A1 | 12/2005 | Johnsen et al. |
| 2006/0039370 A1 | 2/2006 | Rosen et al. |
| 2006/0050694 A1 | 3/2006 | Bury et al. |
| 2006/0126728 A1 | 6/2006 | Yu et al. |
| 2006/0206655 A1 | 9/2006 | Chappell et al. |
| 2006/0282603 A1 | 12/2006 | Onufryk et al. |
| 2007/0050688 A1 | 3/2007 | Thayer |
| 2007/0089031 A1 | 4/2007 | Huffman et al. |
| 2007/0101225 A1 | 5/2007 | Moon et al. |
| 2007/0118743 A1 | 5/2007 | Thornton et al. |
| 2007/0136628 A1 | 6/2007 | Doi et al. |
| 2007/0147489 A1 | 6/2007 | Sun et al. |
| 2007/0157064 A1* | 7/2007 | Falik .................. G06F 11/1012 714/755 |
| 2007/0217253 A1 | 9/2007 | Kim et al. |
| 2007/0233939 A1 | 10/2007 | Kim |
| 2007/0239926 A1 | 10/2007 | Gyl et al. |
| 2008/0005382 A1 | 1/2008 | Mimatsu |
| 2008/0016425 A1 | 1/2008 | Khan et al. |
| 2008/0049869 A1 | 2/2008 | Heinrich et al. |
| 2008/0077843 A1 | 3/2008 | Cho et al. |
| 2008/0148129 A1 | 6/2008 | Moon et al. |
| 2008/0229079 A1 | 9/2008 | Flynn et al. |
| 2008/0229164 A1 | 9/2008 | Tamura et al. |
| 2008/0256280 A1 | 10/2008 | Ma |
| 2008/0256292 A1 | 10/2008 | Flynn et al. |
| 2008/0263265 A1 | 10/2008 | Litsyn et al. |
| 2008/0267081 A1 | 10/2008 | Roeck |
| 2008/0276156 A1 | 11/2008 | Gunnam et al. |
| 2008/0320214 A1 | 12/2008 | Ma et al. |
| 2009/0027991 A1 | 1/2009 | Kaizu et al. |
| 2009/0067320 A1 | 3/2009 | Rosenberg et al. |
| 2009/0077302 A1 | 3/2009 | Fukuda |
| 2009/0164694 A1 | 6/2009 | Talayco et al. |
| 2009/0290441 A1 | 11/2009 | Gatzemeier et al. |
| 2009/0296798 A1 | 12/2009 | Banna et al. |
| 2009/0303788 A1 | 12/2009 | Roohparvar et al. |
| 2009/0307412 A1 | 12/2009 | Yeh et al. |
| 2009/0327802 A1 | 12/2009 | Fukutomi et al. |
| 2010/0085076 A1 | 4/2010 | Danilin et al. |
| 2010/0162075 A1 | 6/2010 | Brannstrom et al. |
| 2010/0185808 A1 | 7/2010 | Yu et al. |
| 2010/0199149 A1 | 8/2010 | Weingarten et al. |
| 2010/0211737 A1 | 8/2010 | Flynn et al. |
| 2010/0211852 A1 | 8/2010 | Lee et al. |
| 2010/0226422 A1 | 9/2010 | Taubin et al. |
| 2010/0246664 A1 | 9/2010 | Citta et al. |
| 2010/0262979 A1 | 10/2010 | Borchers et al. |
| 2010/0293440 A1 | 11/2010 | Thatcher et al. |
| 2011/0010602 A1 | 1/2011 | Chung et al. |
| 2011/0055453 A1 | 3/2011 | Bennett et al. |
| 2011/0055659 A1 | 3/2011 | Tu et al. |
| 2011/0066902 A1 | 3/2011 | Sharon et al. |
| 2011/0072331 A1 | 3/2011 | Sakaue et al. |
| 2011/0119553 A1 | 5/2011 | Gunnam et al. |
| 2011/0161678 A1 | 6/2011 | Niwa |
| 2011/0209031 A1 | 8/2011 | Kim et al. |
| 2011/0225341 A1 | 9/2011 | Satoh et al. |
| 2011/0246136 A1 | 10/2011 | Haratsch et al. |
| 2011/0246842 A1 | 10/2011 | Haratsch et al. |
| 2011/0246853 A1 | 10/2011 | Kim et al. |
| 2011/0296084 A1 | 12/2011 | Nango |
| 2011/0307758 A1 | 12/2011 | Fillingim et al. |
| 2012/0008396 A1 | 1/2012 | Park et al. |
| 2012/0051144 A1 | 3/2012 | Weingarten et al. |
| 2012/0054413 A1 | 3/2012 | Brandt |
| 2012/0096192 A1 | 4/2012 | Tanaka et al. |
| 2012/0140583 A1 | 6/2012 | Chung et al. |
| 2012/0141139 A1 | 6/2012 | Bakhru et al. |
| 2012/0166690 A1 | 6/2012 | Regula |
| 2012/0167100 A1 | 6/2012 | Li et al. |
| 2012/0179860 A1 | 7/2012 | Falanga et al. |
| 2012/0203986 A1 | 8/2012 | Strasser et al. |
| 2012/0239991 A1 | 9/2012 | Melik-Martirosian et al. |
| 2012/0254515 A1 | 10/2012 | Melik-Martirosian et al. |
| 2012/0311388 A1 | 12/2012 | Cronin et al. |
| 2012/0311402 A1 | 12/2012 | Tseng et al. |
| 2013/0013983 A1 | 1/2013 | Livshitz et al. |
| 2013/0024735 A1 | 1/2013 | Chung et al. |
| 2013/0060994 A1 | 3/2013 | Higgins et al. |
| 2013/0086451 A1 | 4/2013 | Grube et al. |
| 2013/0094286 A1 | 4/2013 | Sridharan et al. |
| 2013/0094290 A1 | 4/2013 | Sridharan et al. |
| 2013/0117616 A1 | 5/2013 | Tai et al. |
| 2013/0117640 A1 | 5/2013 | Tai et al. |
| 2013/0145235 A1 | 6/2013 | Alhussien et al. |
| 2013/0163327 A1 | 6/2013 | Karakulak et al. |
| 2013/0163328 A1 | 6/2013 | Karakulak et al. |
| 2013/0176779 A1 | 7/2013 | Chen et al. |
| 2013/0185598 A1 | 7/2013 | Haratsch et al. |
| 2013/0198451 A1 | 8/2013 | Hyun et al. |
| 2013/0205085 A1 | 8/2013 | Hyun et al. |
| 2013/0314988 A1 | 11/2013 | Desireddi et al. |
| 2013/0315252 A1 | 11/2013 | Emmadi et al. |
| 2013/0318422 A1 | 11/2013 | Weathers et al. |
| 2014/0029336 A1 | 1/2014 | Venkitachalam et al. |
| 2014/0040704 A1 | 2/2014 | Wu et al. |
| 2014/0053037 A1 | 2/2014 | Wang et al. |
| 2014/0068368 A1 | 3/2014 | Zhang et al. |
| 2014/0068382 A1 | 3/2014 | Desireddi et al. |
| 2014/0072056 A1 | 3/2014 | Fay |
| 2014/0085982 A1 | 3/2014 | Asaoka et al. |
| 2014/0101510 A1 | 4/2014 | Wang et al. |
| 2014/0164881 A1 | 6/2014 | Chen et al. |
| 2014/0181426 A1 | 6/2014 | Grunzke et al. |
| 2014/0181617 A1 | 6/2014 | Wu et al. |
| 2014/0185611 A1 | 7/2014 | Lie et al. |
| 2014/0198569 A1 | 7/2014 | Kim et al. |
| 2014/0198581 A1 | 7/2014 | Kim et al. |
| 2014/0215175 A1 | 7/2014 | Kasorla et al. |
| 2014/0219003 A1 | 8/2014 | Ebsen et al. |
| 2014/0229774 A1 | 8/2014 | Melik-Martirosian et al. |
| 2014/0281767 A1 | 9/2014 | Alhussien et al. |
| 2014/0281771 A1 | 9/2014 | Yoon et al. |
| 2014/0281800 A1 | 9/2014 | Micheloni et al. |
| 2014/0281808 A1 | 9/2014 | Lam et al. |
| 2014/0281822 A1 | 9/2014 | Wu et al. |
| 2014/0281823 A1 | 9/2014 | Micheloni et al. |
| 2015/0039952 A1 | 2/2015 | Goessel et al. |
| 2015/0043286 A1 | 2/2015 | Park et al. |
| 2015/0046625 A1 | 2/2015 | Peddle et al. |
| 2015/0127883 A1 | 5/2015 | Chen et al. |
| 2015/0131373 A1 | 5/2015 | Alhussien et al. |
| 2015/0149871 A1 | 5/2015 | Chen et al. |
| 2015/0169468 A1 | 6/2015 | Camp et al. |
| 2015/0186055 A1 | 7/2015 | Darragh |
| 2015/0221381 A1 | 8/2015 | Nam |
| 2015/0242268 A1 | 8/2015 | Wu et al. |
| 2015/0332780 A1 | 11/2015 | Kim et al. |
| 2015/0371718 A1 | 12/2015 | Becker et al. |
| 2016/0034206 A1 | 2/2016 | Ryan et al. |
| 2016/0049203 A1 | 2/2016 | Alrod et al. |
| 2016/0071601 A1 | 3/2016 | Shirakawa et al. |
| 2016/0072527 A1 | 3/2016 | Tadokoro et al. |
| 2016/0155507 A1 | 6/2016 | Grunzke |
| 2016/0179406 A1 | 6/2016 | Gorobets et al. |
| 2016/0247581 A1 | 8/2016 | Yoshida et al. |
| 2016/0293259 A1 | 10/2016 | Kim et al. |
| 2017/0213597 A1 | 7/2017 | Micheloni et al. |
| 2018/0033490 A1 | 2/2018 | Marelli et al. |

OTHER PUBLICATIONS

NVM Express, Revision 1.0; Intel Corporation, Mar. 1, 2011, pp. 1-122.

(56) References Cited

OTHER PUBLICATIONS

RapidIO, PCI Express, and Gigabit Ethernet Comparison: Pros and Cons of Using Three Interconnects in Embedded Systems; RapidIO Trade Association, Technical White Paper, Revision May 3, 2005, 1-36.
PCI Express Base Specification Revision 3.0 (PCI Express Base Expression, PCISIG, hereinafter "PCIExpress"), Nov. 10, 2010, 1-860.
RFC 793: Transmission Control Protocol, RFC 793, University of Southern California, IETF,, Sep. 1981, pp. 1-89.
Cai, et al., "Data Retention in MLC NAND Flash Memory: Characterization, Optimization, and Recovery", 2015 IEEE 21st International Symposium on High Performance Computer Architecture (HPCA); Carnegie Mellon University, LSI Corporation, 2015, pp. 551-563.
Chen, et al., "Increasing flash memory lifetime by dynamic voltage allocation for constant mutual information", 2014 Information Theory and Applications Workshop (ITA), 2014, pp. 1-5.
Peleato, et al., "Probabilistic graphical model for flash memory programming", Statistical Signal Processing Workshop (SSP), 2012 IEEE, 2012, pp. 1-4.
Wu, et al., "Reducing SSD Read Latency via NAND Flash Program and Erase Suspension", Proceedings of FAST'2012; Department of Electrical and Computer Engineering Virginia Commonwealth University, Richmond, VA 23284, 2012, pp. 117-123.

\* cited by examiner

PRIOR ART

PRIOR ART

1450

RECEIVING A MESSAGE POLYNOMIAL, WHEREIN THE MESSAGE POLYNOMIAL INCLUDES DATA BITS AS COEFFICIENTS
1455

RECEIVING A SELECTED T REDUCTION PARAMETER VALUE, WHEREIN THE SELECTED T REDUCTION PARAMETER VALUE IS A MAXIMUM NUMBER OF T REDUCTIONS APPLIED TO AN ORIGINAL T ERROR CORRECTING CODE VALUE DURING THE BCH CODING TO ACHIEVE A REDUCED NUMBER OF TS, THE REDUCED NUMBER OF Ts BEING LESS THAN THE ORIGINAL T ERROR CORRECTING BCH CODE VALUE AND USED FOR THE BCH CODING
1460

BASED ON THE SELECTED T REDUCTION PARAMETER VALUE AS COMPARED TO THE ORIGINAL T ERROR CORRECTING CODE VALUE, MULTIPLIER OPERATIONS ARE APPLIED, ENCODING OPERATIONS ARE APPLIED AND DIVIDER OPERATIONS ARE APPLIED TO THE MESSAGE POLYNOMIAL TO ACHIEVE AN OUTPUT, WHEREIN THE OUTPUT INCLUDES PARITY BITS
1465

FIG. 14B

VARIABLE T BCH ENCODING

FIELD OF THE INVENTION

Embodiments of the invention generally relate to the processing of digital data streams with error management. More particularly, the invention relates to processing of digital data streams with error management in Flash storage media.

BACKGROUND

Writing data, erasing data and reading data to and from memory cells can introduce noise into the process, which will result in errors in the data read from the memory cells. To ensure that the data is error free following a read operation, error correction techniques are employed. For example, error correction codes (ECC) are used to encode the data before it is written to the memory cells and then the encoded data are decoded following the read operation. A code that is used to correct more than one error in data is, for example, Bose-Chaudhuri-Hochquenghem (BCH). With ECC, redundant information is stored or transmitted alongside the regular information bearing data, to permit an ECC decoder to deduce the originally transmitted or stored information even in the presence of errors.

Depending on the number of error corrections desired, BCH codes take up a certain amount of area and consume a certain amount of power. In order to provide a greater number of error corrections, more implementation space for BCH encoders is required and more power must be consumed during operation. Thus, limitations exist with conventional BCH encoding technology.

BRIEF DESCRIPTION OF THE DRAWINGS

These drawings and the associated description herein are provided to illustrate specific embodiments of the invention and are not intended to be limiting.

FIG. 14B illustrates a flow diagram of a method for reducing circuit implementation area during BCH encoding, in accordance with an embodiment.

In this description, reference is made to the drawings in which like reference numerals may indicate identical or functionally similar elements. The drawings referred to in this description should not be understood as being drawn to scale unless specifically noted.

DESCRIPTION OF EMBODIMENTS

Figure 1:
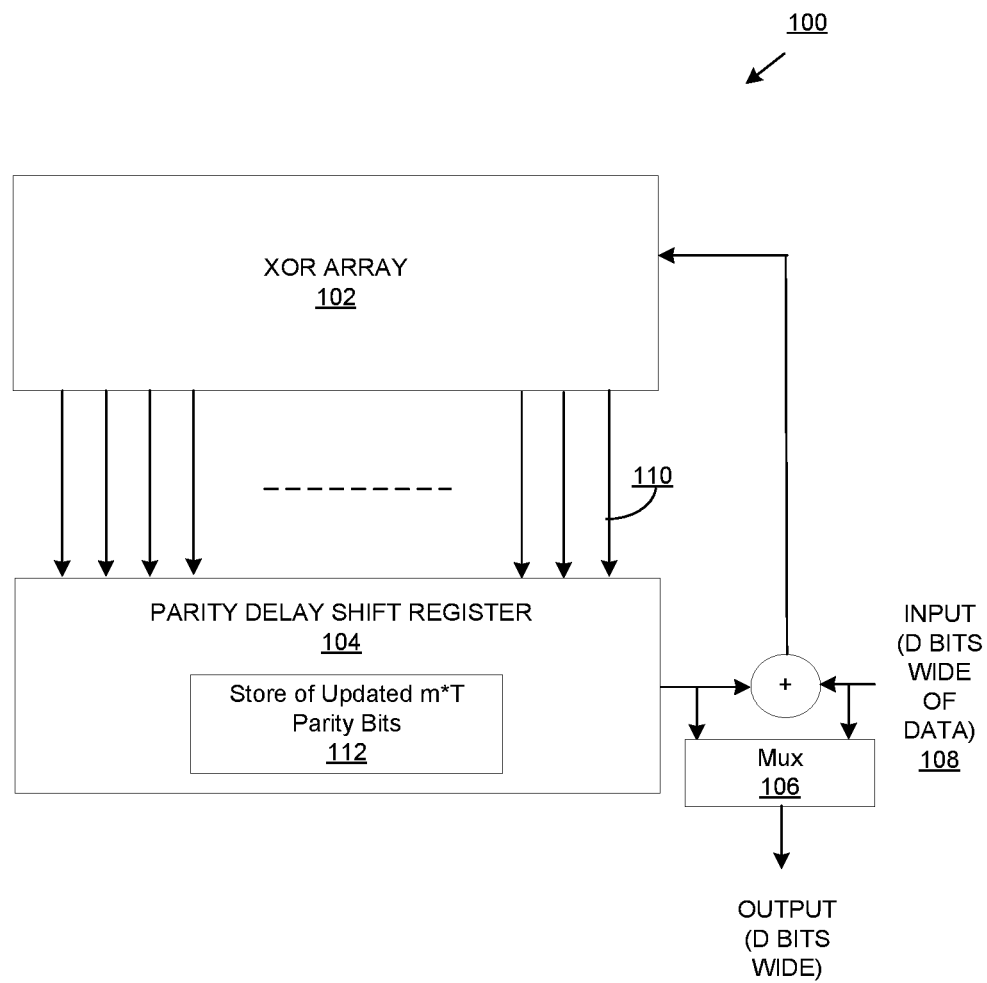
FIG. 1 illustrates a block diagram of a conventional high speed encoder.

Various embodiments are described below, with reference to detailed illustrative embodiments, in the context of variable error bit ("T") Bose, Chaudhuri, and Hocquenghem (BCH) encoding. It will be apparent from the description provided herein that the systems, apparatuses and methods can be embodied in a wide variety of forms. Consequently, the specific structural and functional details disclosed herein are representative and do not limit the scope of embodiments of the present technology.

Terminology

The following definitions and examples may be helpful in understanding the discussion below. The examples are not intended to be limiting.

ECC: Error Correction Coding is a class of techniques in which redundant information (parity) is added to information bits in such a way that if errors are subsequently introduced, the original information bits can be recovered. ECC can also stand for error correction code, corresponding to the parity symbols themselves. An ECC has a correction capability, which represents its ability to correct errors. In the simplest form, the ability to correct errors may be limited to a certain number of error bits (correctable errors) T per ECC code word length.

BCH code: Corrects up to a fixed number T of bit errors in a forward error correction (FEC) block; BCH codes are constructed using finite field arithmetic-based encoding and decoding. Standard BCH encoding and decoding are understood to those skilled in art. A more comprehensive discussion of error control techniques, including BCH coding, can be found in the book, "Error Control Coding (Second Edition)" by Shu Lin and Daniel J. Costello, Jr., published in 2005 by Pearson (New York City, N.Y.).

Two examples illustrating the expression for a BCH FEC block are shown below. Example two is more applicable to a flash memory situation in which "N", the total number of bits in a packet, is large. Definitions of the variables used in examples one and two are as follows:

"K": Maximum number of data bits.

"N": Total number of data bits in packet (i.e. K+P ["P" is defined shortly]). Of note, N is related to "m" (defined shortly) as follows: $2^m - 1 = N$ (maximum number of data bits that can be supported in a FEC block).

"T": Number of correctable errors in the packet.

"m": The number of parity bits required per T.

"P=m*T": Number of parity bits needed, to be added to a FEC block.

(N,K) or (N,K,T): These notational forms are used periodically in the following discussion and are short-hand forms of describing FEC block parameters.

Example One

When N=255, m=8 (supports up to N=255), and T=4,
then P=8×4=32 (bits of parity needed to be added to the FEC block);
K=Maximum number of data bits, thus K=255−32=223, i.e. (K=N−bits of parity needed to be added to the FEC block);
Data size can be any number between 1 and 223 bits; and the BCH FEC block is then expressed as (255, 223, 4).

Example Two

When K=33792, m is selected as 16, and T=64, then P=16×64=1024 bits of parity needed to be added to the FEC block.
The BCH FEC block is then expressed as (34816, 33792, 64), whereby N=34816.
Of note, usually, K and T are defined by the application and then the appropriate m is selected, as is done in Example Two. Additionally, as is also shown in Example Two, in some cases, very large T and m values are required (e.g., in flash device use cases).

Overview of Discussion

Figure 2:
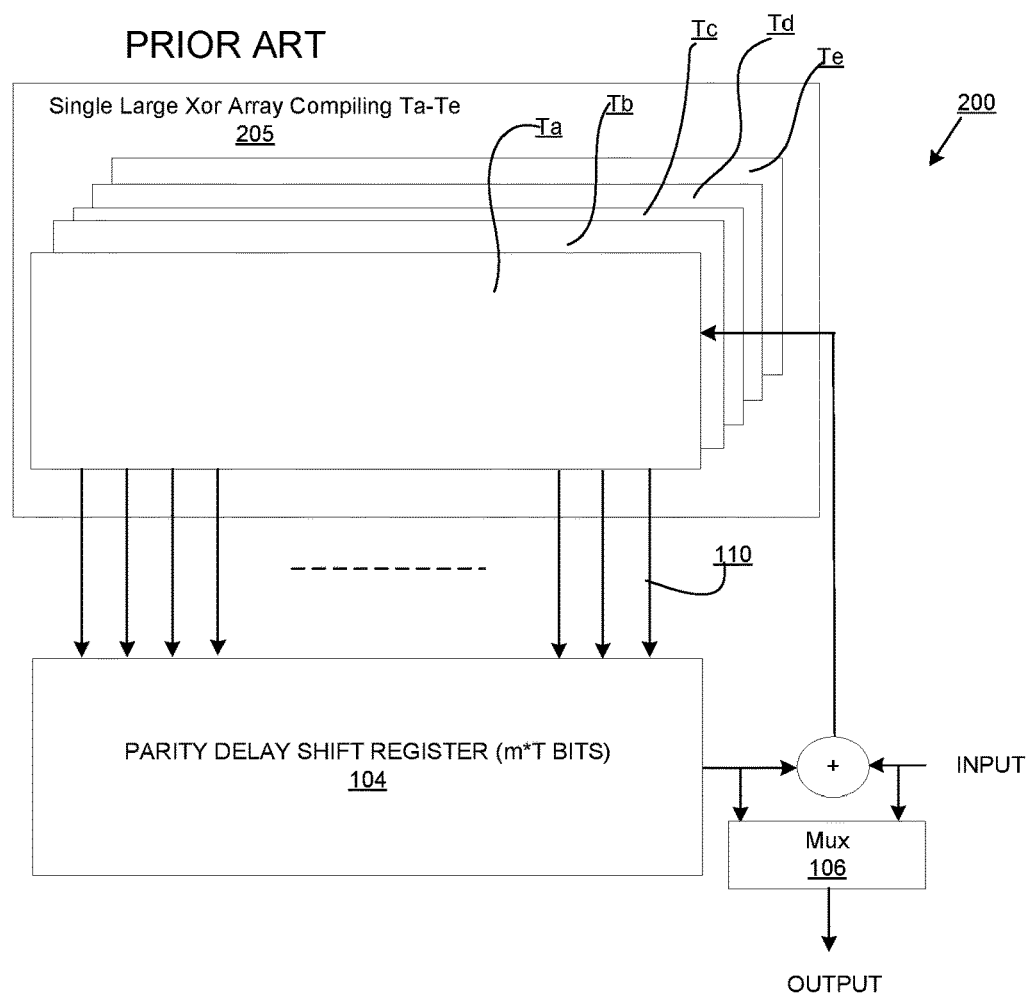
FIG. 2 illustrates a block diagram of a conventional high speed encoder with multiple XOR arrays, T1, T2, T3, T4 and T5.
Figure 3:
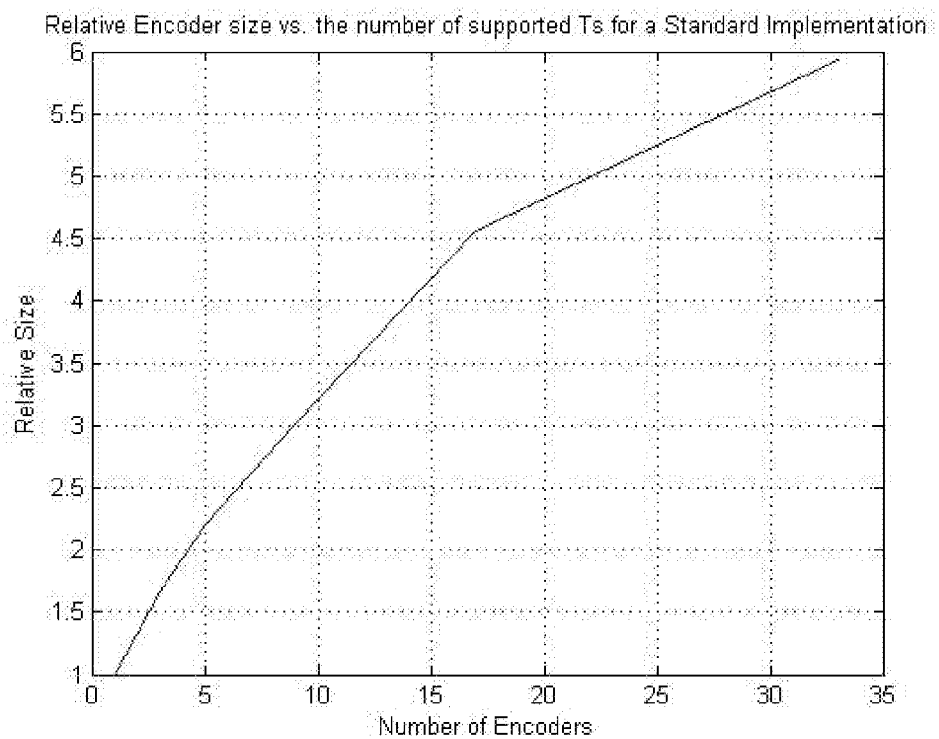
FIG. 3 shows is a graph illustrating the relative encoder size versus the number of supported Ts for conventional implementation.
Figure 4:
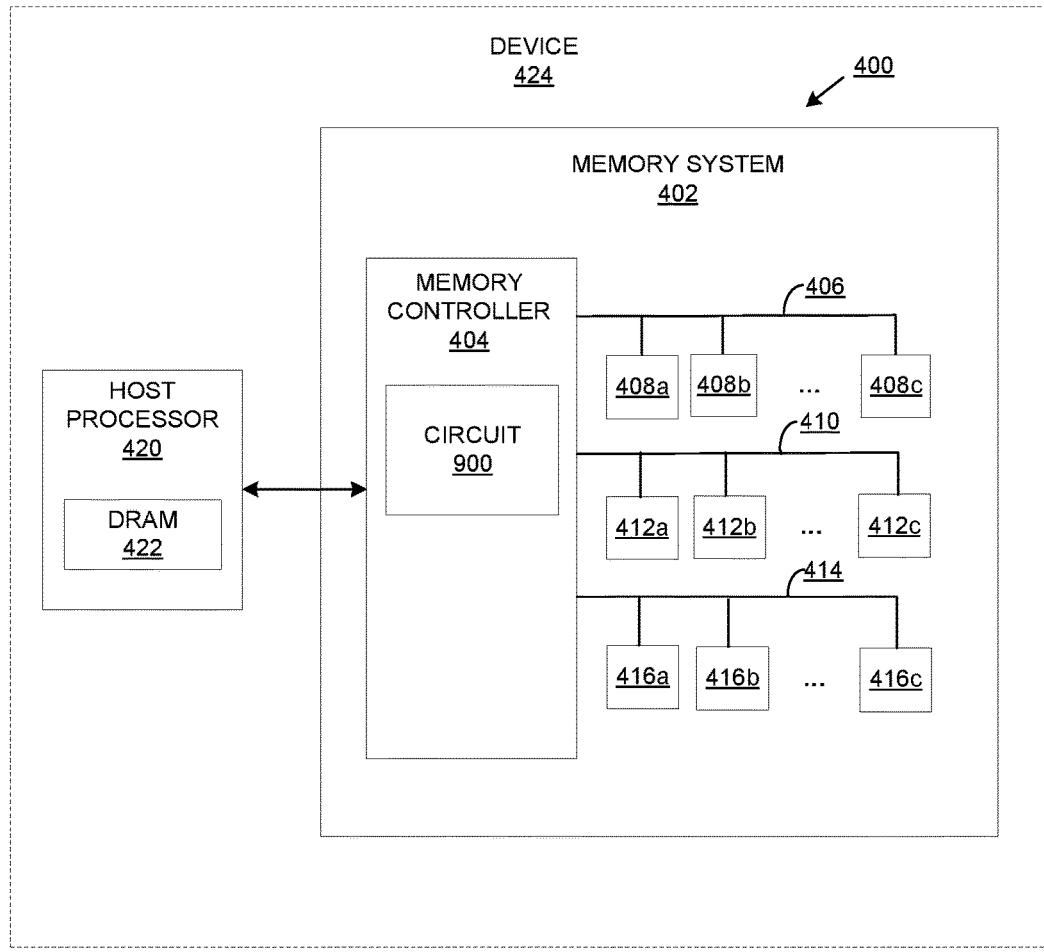
FIG. 4 illustrates a block diagram of a memory system, in accordance with an embodiment.
Figure 5:
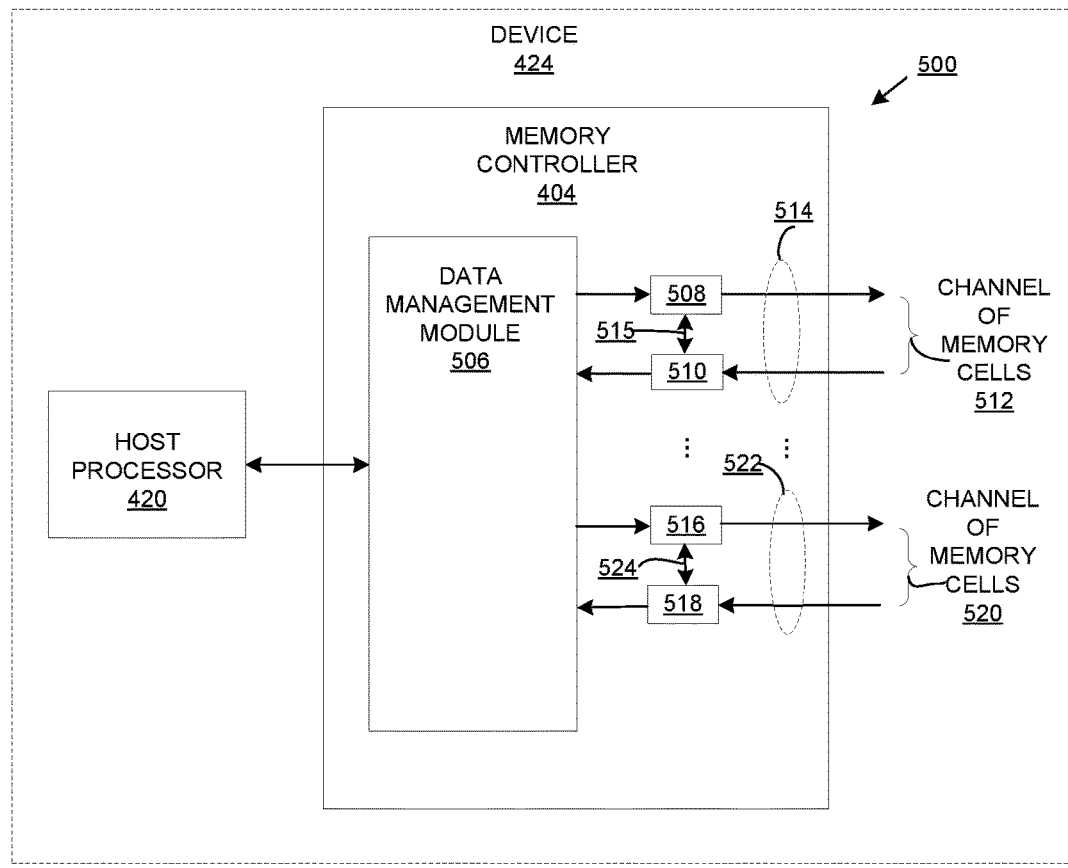
FIG. 5 illustrates an exploded view of a memory controller, in accordance with an embodiment.
Figure 10:
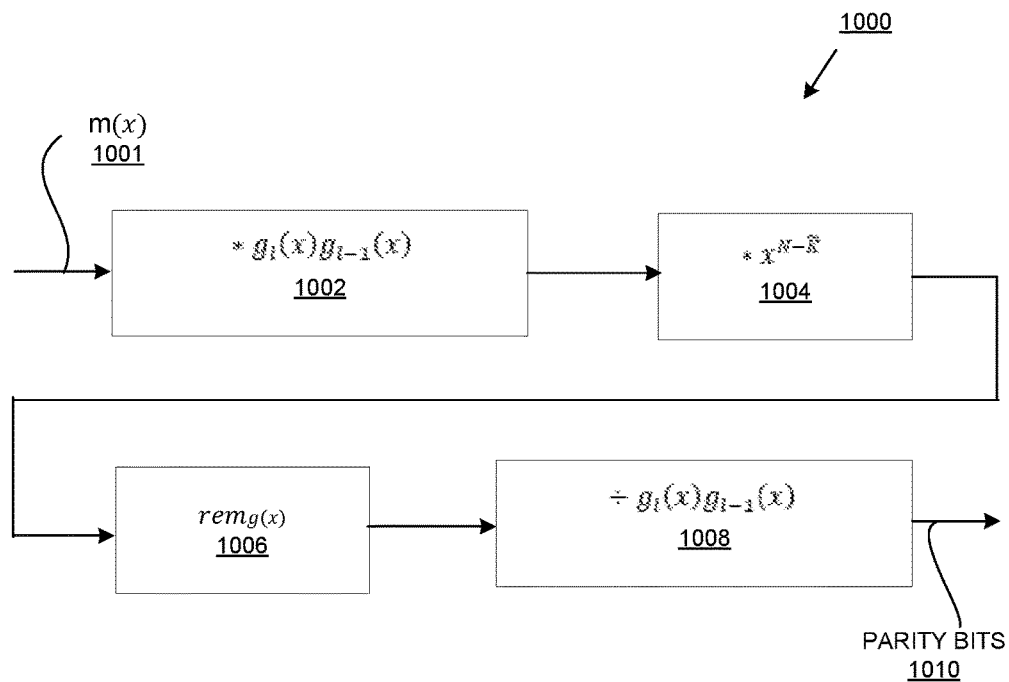
FIG. 10 illustrates a block diagram of an example operation showing the reduction of T by two, in accordance with an embodiment.
Figure 11:
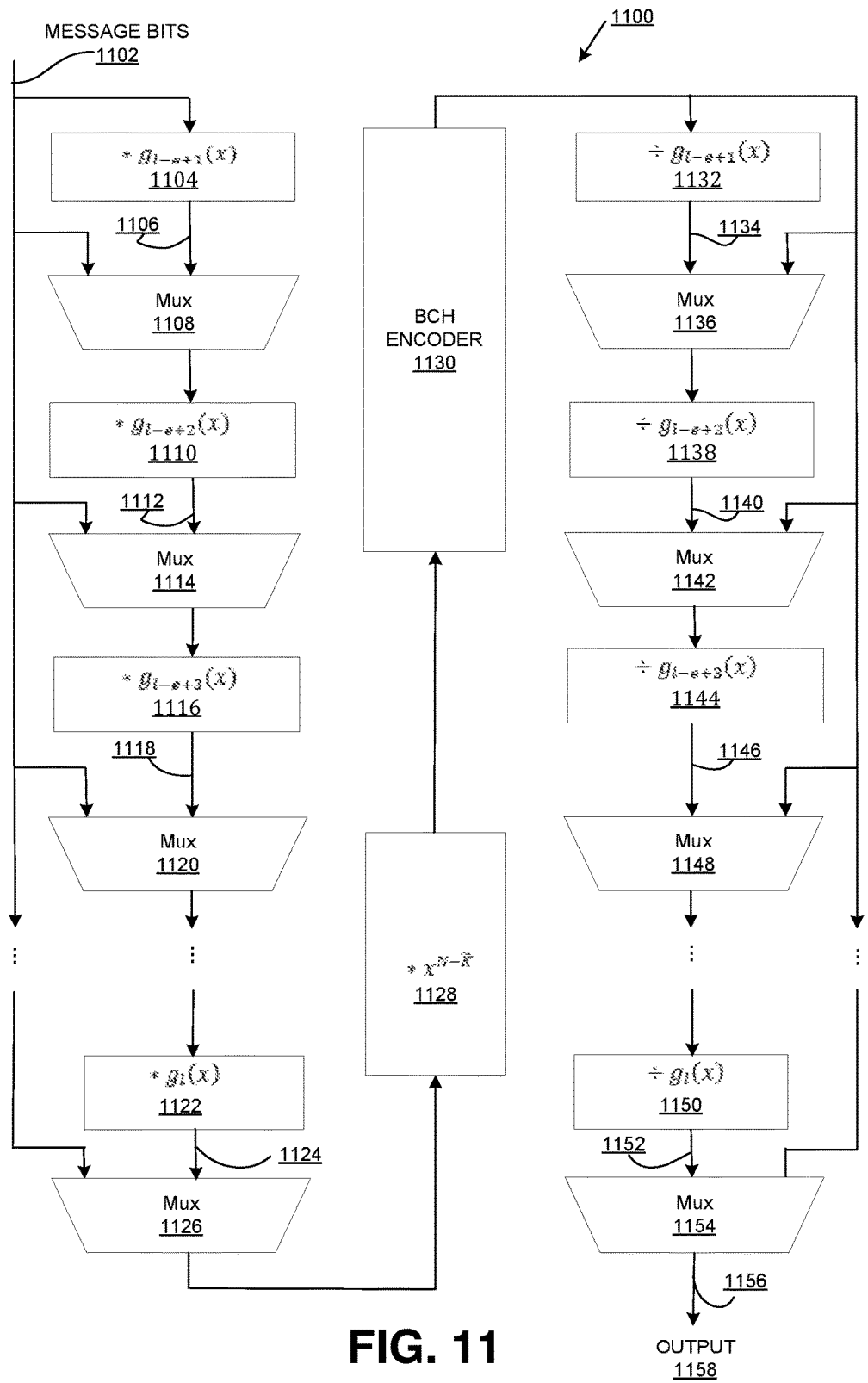
FIG. 11 illustrates a block diagram of an example operation illustrating the reduction of T by more than two, in accordance with an embodiment.
Figure 12:
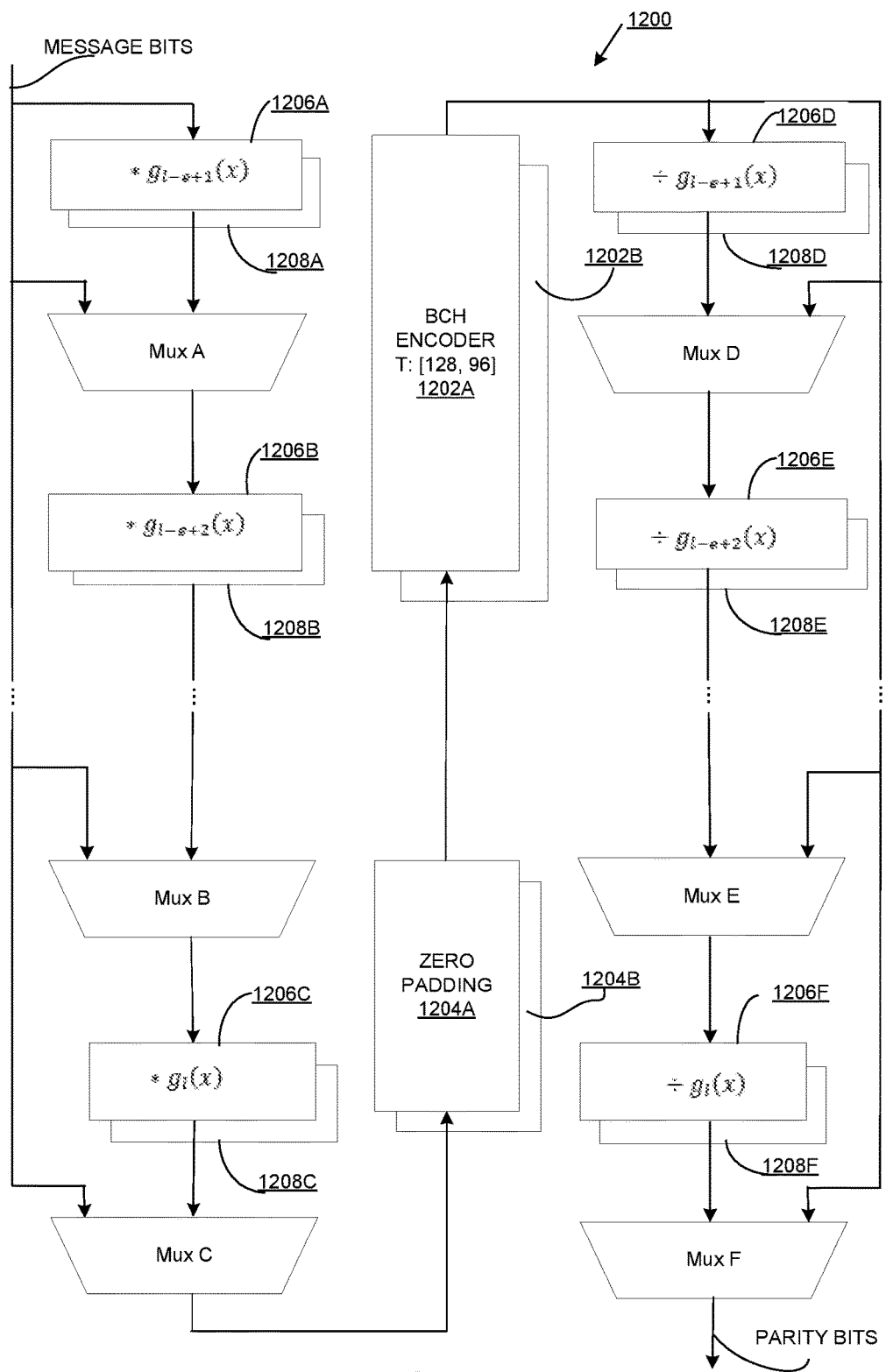
FIG. 12 illustrates a block diagram showing variable T reduction methods, according to an embodiment.
Figure 13:
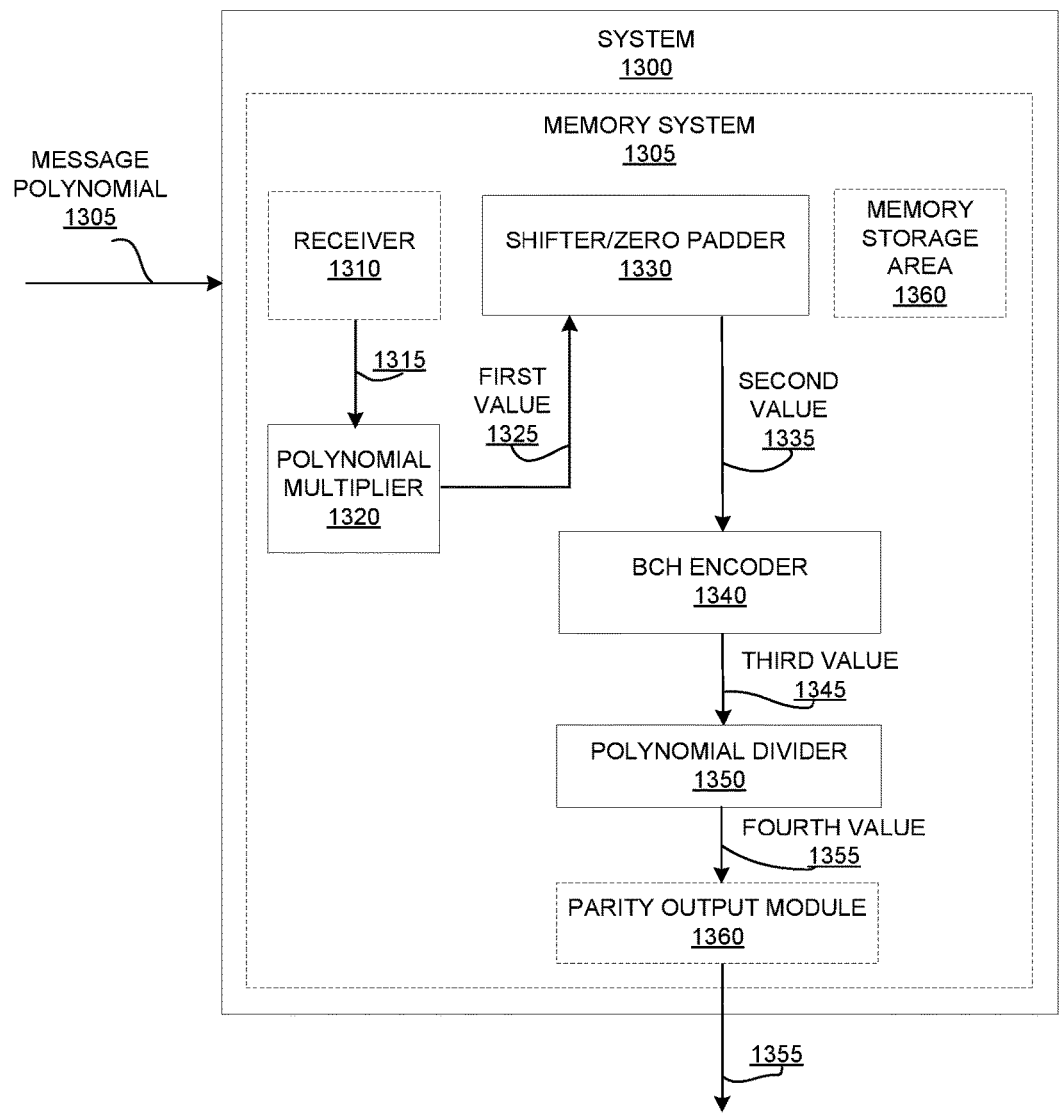
FIG. 13 illustrates a block diagram of a system for encoding a variable T BCH, in accordance with an embodiment.

The discussion will begin with a description of conventional approaches for BCH encoding and the limitations involved. FIGS. 1-3 are discussed in the context of XOR arrays upon which conventional BCH code operates. The discussion will continue with a description of FIGS. 4 and 5, illustrating an example memory system at which embodiments of the present technology reside and/or upon which embodiments operate. A description of FIGS. 6-12 then follows, according to embodiments. More specifically, FIGS. 6-9 present an overview of an example variable T BCH encoding process and an example T−1 (T minus one) reduction. FIGS. 10 and 11 present an example T−2 reduction and a reduction of T greater than two, respectively. FIG. 12 presents an example reduction of T greater than two in cooperation with multiple BCH encoders. FIGS. 13 and 14 present an example system and method, according to various embodiments. FIG. 15 is discussed while illustrating a computer system (data processing device such as a computer, smart phone, tablet computer, etc.) in which embodiments of the invention may be used.

Conventional BCH Encoding

When a host processor issues write and read commands to a memory system that includes one or more memory chips, data is written to the memory cells of the memory chips. The introduction of undesirable errors occurs when this transmitted data is changed by the environment, thus changing a value of a bit from an intended value to an unintended value. Such undesirable errors can be introduced by any type of memory cell that is placed in communication with a memory controller.

More particularly, data (e.g., images, email) is transmitted through communication channels to one or more memory chips. This transmitted data is essentially an ordered set of ones and zeros. As the data is transmitted through the communication channels, the data tends to become corrupted. For instance, if cell phone A transmits an image (message) to cell phone B, the movement of the data (comprising the image) through a communication channel is what introduces errors into the data. In an example of errors being introduced into transmitted data, information is written to flash memory, which is stored on a chip. When the data that is read back is not the same as the data that was intended to be written to the flash memory, the data is said to contain errors and corruption occurs.

To counter this corruption, a method called error code correction (ECC) is performed. BCH coding is a type of ECC. FEC is a technique used for controlling errors in data transmission over unreliable or noisy communication channels, through ECC, such as BCH coding. The central idea regarding FEC is that the sender encodes the message in a redundant way by using an error correcting code. Thus, in FEC, the redundancy allows the receiver to detect a limited number of errors that may occur anywhere in the message, and correct these errors without retransmission of the message. However, such a method of error identification costs a fixed, higher forward channel bandwidth, since additional bits must be transmitted along with the data. FEC is therefore applied in situations where retransmissions are costly or impossible, such as one-way communication links and when transmitting to multiple receivers in multicast. Most telecommunication systems use a fixed channel code that is designed to tolerate the expected worst-case bit error rate. However, some systems adapt to the given channel error conditions by using a variety of FEC rates, adding more error-correction bits per packet when there are higher error rates in the channel or taking them out when they are not needed.

One main type of FEC code is the classical block code. Block codes work on fixed-size blocks (packets) of bits or symbols of a predetermined size. Practical block codes can generally be hard-decoded in polynomial time, increasing in length as their block length increases. The aforementioned BCH code is one such type of block code (and thus one type of error correction technology).

BCH codes are used in applications such as, but not limited to, satellite communications, compact disc players, DVDs, disk drives, solid-state drives and two-dimensional bar codes. Additionally, BCH encoders and decoders are used in conjunction with flash devices. Flash devices require the ability to support a flexible coding rate since channel conditions on flash devices are highly variable in at least the following use case scenarios, as known in the art: device aging; retention requirements; type of flash memory; page type; wear leveling; and die to die variations. The term, "coding rate", refers to the amount of data that is to be transmitted divided by the full size of the block that is transmitted, including the amount of parity bits, P, that are attached. (Coding Rate=K/N.) Thus, if 1,000 bits of data are to be transmitted, along with an attached 100 bits of parity, then the coding rate would be 1,000 divided by 1,100, or 91%.

In a standard BCH application, the value of T is selected based on an understanding of the expected number of errors that occur during data reception. Higher values of T are required for higher error rate systems. In general, the coding rate decreases as the error rate and the value of T increases. Additionally, higher settings of T increase the area of an encoder's circuit, increase the overall FEC block size and increase the area and power consumption of the decoder. Conventional technology many times requires an overabundance of Ts for any expected bit-error rate.

Flash memory storage presents a challenge to the conventional standard of providing a number of parity bits (that are predetermined to be needed) to a FEC block, P, during BCH coding. For example, since the amount of parity bits needed by flash memory storage is variable, various different values of parity bits, P, are needed to be added to different FEC blocks. In one instance, each of 600 parity bits, 700 parity bits, 800 parity bits, and 900 parity bits may be utilized. The conventional BCH encoder is not well equipped to operate with variable parity bit values. For example, conventionally, every time that the amount of parity bits, P, on a coding block is changed from, for example, 700 parity bits for FEC block A to 900 parity bits for FEC block B, then an entirely new BCH encoder is needed. Thus, conventionally, with a flash device, since a variable number of parity bits, P, is used, then many different BCH encoders are also used, and the conventional circuit becomes increasingly large and more inefficient. Of note, a group of individual FEC blocks (e.g., FEC block A, FEC block B, etc.) has a predetermined P, and each individual FEC block has its own setting of P (for example, FEC block A may have a predetermined P of 700 and FEC block B may have a predetermined P of 900).

An overview of a conventional BCH encoding method, as is known to those skilled in the art, and occurring at a conventional BCH encoder is presented as follows:

Step 1:

Data bits $d=[d_0, d_1, \ldots, d_{K-1}]$ are first represented in polynomial form as follows: $d(x)=d_0+d_1x+ \ldots +d_{K-1}x^{K-1}$.

Here, $d(x)$ is a large polynomial with binary coefficients which has the input data bits as its binary coefficients.

Step 2:

$x^{N-K} d(x)$ is then divided by the generator polynomial of a T error correcting (N,K) BCH code.

$g(x)=g_0+g_1x+ \ldots +g_{N-K}x^{N-K}$.

$g(x)$ is the lowest order polynomial over GF(2) that has $\alpha$, $\alpha^2, \alpha^3, \ldots \alpha^{2T}$ as its roots, where $\alpha$ is a primitive element in the Galois Field $(GF)[2^M])$. N–K is the total number of bits in a packet minus the number of data bits, which equals the parity size. The generator polynomial is the least common multiple of the minimum polynomial associated with the $\alpha^j$ roots, that is:

$g(x)=\Pi g_i(x)$.

The $g(x)$, also known as the generator polynomial, is the product of a number of minimal polynomials all multiplied together.

BCH codes rely on the mathematical structure of Extended Galois Fields; GF are known to at least those skilled in the art of BCH coding and GF.

Step 3:

The remainder $r(x)$ of step 2 above is then calculated. $r(x)$ represents the BCH parity bits in polynomial form. The remainder is found as compared to a known generator polynomial.

Step 4:

The BCH code word $C(x)$ polynomial is constructed as:

$C(x)=r(x)+x^{N-K}d(x)$.

In general, the more parity bits that are included in the transmitted message, the stronger the correction of that message will be.

FIG. 1 is a block diagram illustrating a conventional high speed BCH encoder 100 known in the art. High-speed encoders, such as the BCH encoder 100, accept "D" bits wide of input per clock cycle. For example, BCH encoders may accept, in one instance, 16 bits wide of input per clock cycle. A clock cycle, in general, is the time between two adjacent pulses of the clock that sets the tempo of the computer processor. The number of pulses/second equals the clock speed in Megahertz. In one example, the BCH encoder 100 receives an input 108 of D, wherein D=16 data bits wide per clock cycle.

A central XOR array 102 is shown and is arranged to receive input 108, from a Mux (multiplexer) (not shown), the input 108 including an amount of bits sized for any value of exactly D bits wide. Once the D value is selected, it can generally only support that one selected setting. Of note, the possible supported D in a single clock cycle for any encoding device is from one to K data bits and ideally, K divided by D will be an integer. An encoder receives a total of K values at its input and then presents K+P values at its output. For BCH encoding, the first K input and K output values are identical. After the K values are output, the P values are generated.

For example, in one instance, the m*T parity bits are set to zero at the start of encoding. D bits of data come into the XOR array 102 and the XOR array 102 updates the m*T parity bits. The central XOR array 102 sends the updated m*T parity bits 110 to the parity delay shift register 104. The parity delay shift register 104, not only stores the updated m*T parity bits 110, but also, according to conventional types commercially available, enables periodic shifting along the register (of a cascade of flip flops making up the parity delay shift register 104) such that the inputs are sequentially added to modify the stored data accordingly.

FIG. 2 is a block diagram illustrating a conventional high speed encoder 200 with multiple XOR arrays, Ta, Tb, Tc, Td and Te (hereinafter "Ta-Te", unless specifically noted otherwise) for T=5. When more Ts are specified, a greater number of XOR arrays are utilized, resulting in a higher power consumption and a more costly system overall.

Conventionally, a plurality of central XOR arrays, such as XOR arrays Ta-Te are provided, each of which is arranged for a particular supported T (the predetermined number of correctable errors in the packet). In other words, for each T, conventionally, there will be a different central XOR array 102. For example, if T=5, there will be five XOR arrays, each XOR array arranged for each T of the five Ts. Generally, there is little sharing between these different encoder XOR arrays while BCH encoding is occurring. However, the plurality of XOR arrays Ta-Te will generally be compiled into a single larger XOR array, such as single larger XOR array 205 that combines the operation of the plurality of XOR arrays. The single larger XOR array 205 uses a larger area and also consumes more power than the individual XOR array 102.

In this example of a conventional arrangement, the implementation of the plurality of central XOR arrays Ta-Te is such that the plurality of central XOR arrays are arranged in parallel with each other. Of note, the number of supported XOR arrays is determined based on the required number of code rates that also need to be supported by the BCH encoder. For example, in terms of a flash device, the BCH encoder may support the following five different T values (or five T XOR arrays) that correspond to a particular condition of the flash device: at the start of the flash device life when the code rate is higher, T=10; at 1,000 PE cycles of the flash device, T=20; at 5,000 PE cycles of the flash device, T=40; at 10,000 PE cycles of the flash device, T=60; at the end of life of the flash device when the code rate is lower than at the start of use of the flash device life, T=100. In this example, there are only five T values for selection and the controller will select from any of the above five T values depending on the conditions on the flash device and the errors that will likely occur. For example, early in the flash device's life, the controller will select a low T value, such as T=10. While at the end of the flash device's life, the controller will select a high T value, such as T=100. Of note, conventionally, each T value is associated with a different XOR array, and the higher the T value that is selected, the lower the code rate that results for the system.

Thus, depending on each use situation, a flash drives require a variable amount of error correction strength (parity overhead). Conventionally, the different XOR arrays provide different code rate options to the BCH encoder. In one conventional operational instance of a flash drive that uses BCH encoding and has thirty-two XOR arrays, all thirty-two XOR arrays are utilized. While in another conventional operational instance of the same system, only one XOR array of the thirty-two XOR arrays is utilized. Even though only one XOR array is utilized in one of the foregoing examples, the area within the hardware is still burdened with all thirty-two XOR arrays such that the thirty-two XOR arrays take up space and consume power.

FIG. 3 shows a graph illustrating the relative size of a conventional encoder circuit that can support different values for T. The graph shows that the relative size (area) of a conventional single encoder circuit that supports one T is exactly one. As can be seen, the relative size, for example, of a conventional encoder circuit that can support five different values of Ts is about two times the size of the conventional encoder circuit that supports one T. When thirty different Ts are to be supported, the relative size of the conventional encoder circuit is about six times the size of the conventional encoder circuit that supports just one T.

Thus, a method that supports a maximum number of Ts while using the smallest number of XOR arrays as is necessary for operation is desired for applying BCH ECC. The smaller the number of XOR arrays used will result in a correspondingly smaller amount of implementation area needed to enable the operation of the XOR arrays, and thus also reduce the amount of power consumed by the circuit. According to an embodiment of the present invention and with reference to FIG. 3, the size of the encoder circuit of an embodiment is typically less than one-half of the size of the conventional encoder circuit; this situation is particular to when the number of supported T values is large. Additionally, an embodiment of the present technology repeatedly reuses a single BCH encoder or a small number of BCH encoders. For example, small circuitry is positioned either in parallel, or serially before and/or after the standard BCH encoder, thereby and as will be described below, allowing such reuse of the BCH encoder.

The system and process for variable T BCH encoding of the present technology will next be described in detail.

Variable T BCH Encoding

Embodiments of the present technology enable a reduced number of XOR arrays to be used during BCH encoding while also enabling a reduced number of BCH encoders to be used and reused during operation, thereby creating a smaller and more efficient circuit than the conventional circuit described above. Embodiments may be used with flash storage technology, though are not limited to use with such technology. Even though flash storage requires a higher granularity of desired code rates, as described herein, one embodiment may use just a single BCH encoder to handle a variable amount of attached parity bits. In one embodiment, the single BCH encoder is reused for each parity bit value, thus making the circuit smaller and more efficient. Another embodiment uses multiple BCH encoders, wherein each BCH encoder supports a different range of T values. Embodiments improve the decoding performance over a range of code rates, while reducing the implementation area. This occurs because embodiments enable a particular T to be selected for a given use case scenario (e.g., channel condition), wherein the possible T selections are unrestricted, in that any value of T that is likely to be needed is available for selection.

In contrast with embodiments, conventional technology provides for a less agile implementation having restrictions for the range of possible T selections, and thereby causing a lower bit error rate ("BER") performance. For example, and as already stated herein, in a conventional BCH application, the value of T is selected based on an understanding of the expected number of errors that occur during data reception, and the available T selections are restricted (limited such that not every T value that is likely to be needed is available for selection). Conventional technology has an abundance of XOR arrays that remain unused during much of the operation of flash devices, thus requiring a more sizable implementation area for functioning. The higher the expected number of errors, the higher the values of T that are selected. In general, the coding rate decreases as the error rate and the value of T increases. Additionally, higher settings of selected T (and thus a higher number of XOR arrays) increase the implementation area used by the BCH encoder's circuit, increase the overall FEC block size and increase the area and power consumption of the decoder. In general, it is desirable to operate with the minimum value of Ts, and thus, the minimum number of XOR arrays, for an expected bit-error rate. However, conventional technology requires a large number of Ts for large expected bit-error rates, and thus a large number of XOR arrays.

FIG. 4 illustrates, generally at 400, a block diagram of a memory system 402, according to an embodiment of the invention. The memory system 402, in one embodiment, resides on a device 424. In another embodiment, both the memory system 402 and a host processor 420 reside on the device 424. With reference to FIG. 4, the memory system 402 includes a memory controller 404. The memory controller 404 is coupled to a number of memory chips. In one embodiment, the memory system 402 includes a circuit 900 (See FIG. 9), disposed on, or external to (though communicatively coupled with), the memory controller 404. In various embodiments, the memory cells are configured into a general number of channels of memory (e.g., element 406, element 410 and element 414). For example, element 406 represents a first channel of memory. The first channel 406 includes a general number of memory chips 408a, 408b, through 408c. Similarly, element 410 represents a second channel of memory. The second channel 410 includes a general number of memory chips 412a, 412b, through 412c. Element 414 represent the $i^{th}$ channel of memory with memory chips 416a, 416b, through 416c. Each of the memory chips 408a, 408b, through 408c, 412a, 412b, through 412c, and 416a, 416b, through 416c contains a plurality of memory cells.

In one embodiment, the memory system 402 is known in the art as flash memory. The memory system 402 can be configured as a solid state disk (SSD) or implemented as removable memory commonly referred to as a thumb drive or a memory stick. In one embodiment, a non-limiting example of an SSD is made using 512 two gigabit NAND chips. The 512 two gigabit NAND chips are configured sixteen to a channel with a total of thirty-two channels for a nominal capacity of one Terabyte (TByte) of storage. Other configurations of chip size, number of chips, and number of channels can be configured depending on the particulars of the use case. Embodiments of the invention are not limited by the size of the memory system selected for a given use case. In the example above, NAND devices were used. Alternatively, NOR memory can be used in place of the NAND memory. Embodiments of the invention are not limited by the particular technology or circuit design underlying a memory cell. Embodiments of the invention can be used with user defined memory cells, with resistive memory, and with memory cells that are yet to be invented.

The memory controller 404 is communicatively coupled, wired and/or wirelessly, to a host processor 420. The host processor 420 includes a dynamically accessible memory indicated by DRAM 422. In various embodiments, the host processor 420 (as well as the communicatively coupled memory system 402) can reside in a variety of devices such as a computer of any type (e.g., stationary, desk top, tablet, and notebook, without limitation). In other embodiments, the memory system 402 can be used with various portable devices such as mobile phones, digital cameras, digital video cameras, global position systems, audio/visual media devices as well as devices yet to be invented. Embodiments of the invention are not limited by the purpose or name of the device in which the memory system 402 is used.

In various embodiments, the memory controller 404 may be implemented by one or more hardware components, one or more software components, or some combination thereof. Examples of hardware components include but are not limited to a combinational logic circuit, a sequential logic circuit, a microprocessor, an embedded processor, an embedded controller or the like. Examples of software components include but are not limited to a computing program, computing instructions, a software routine, e.g., firm-ware or the like.

In various embodiments, the memory system 402 is implemented in an integrated circuit device, which may include an integrated circuit package containing the integrated circuit. In some embodiments, the memory system 402 is implemented in a single integrated circuit die. In other embodiments, the memory system 402 is implemented in more than one integrated circuit die of an integrated circuit device which may include a multi-chip package containing the integrated circuit.

FIG. 5 illustrates, generally at 500, a block diagram of the memory controller 404, according to an embodiment of the invention. In one embodiment, the memory controller 404 resides on the device 424. With reference to FIG. 5, the memory controller 404 contains a data management module 506. The data management module 506 is coupled to a circuit 508 that comprises a BCH encoder, according to an embodiment. The data management module 506 also is coupled with a decoder 510. The circuit 508 has components equivalent to that of the circuit 900 discussed herein with reference to FIG. 9. The circuit 508 and the decoder 510 are coupled to a first channel of memory cells indicated at 512 by a data communication path 514. In various embodiments, the first channel of memory cells 512 is equivalent to the first channel 406 of the memory system 402 (FIG. 4). The data management module 506, in one embodiment, is coupled to the host processor 420. Depending on the size of the memory system 402, additional circuits comprising a BCH encoder and an associated decoder are coupled to the data management module 506. A general number of circuits, including encoder/decoder pairs, are indicated by the circuit 516 and a decoder 518. The circuit 516 has equivalent components as the circuit 900 discussed herein with reference to FIG. 9. The circuit 516 and the decoder 518 are coupled to memory cells 520 by a data communication path 522. In various embodiments, the circuit 516 and the decoder 518 are equivalent to the "$i^{th}$" channel 414 (FIG. 4). Optionally, the circuit 508 and the decoder 510 are coupled together by a communication link 515 to facilitate passing information there between. Similarly, the other circuits, such as circuit 516, are coupled to the corresponding decoder 518 of the given channel by the communication link 524 to facilitate passing information there between.

It should be appreciated that FIGS. 4 and 5 represent just one embodiment of the invention, and that there may be many topologies used by the invention. The total throughput is generally the same during the encoding or the decoding process.

In various embodiments, the data management module 506, circuit 508, decoder 510, communication link 515, circuit 516, decoder 518, and communication link 524 may be implemented by one or more hardware components, one or more software components, or some combination thereof. Examples of hardware components include but are not limited to a combinational logic circuit, a sequential logic circuit, a microprocessor, an embedded processor, an embedded controller or the like. Examples of software components include but are not limited to a computing program, computing instructions, a software routine, e.g., firm-ware or the like.

In various embodiments, the data management module 506 is implemented in an integrated circuit device, which may include an integrated circuit package containing the integrated circuit. In some embodiments, the data management module 506 is implemented in a single integrated circuit die. In other embodiments, the data management module 506 is implemented in more than one integrated circuit die of an integrated circuit device which may include a multi-chip package containing the integrated circuit.

In various embodiments, the circuit 508 is implemented in an integrated circuit device, which may include an integrated circuit package containing the integrated circuit. In some embodiments, the circuit 508 is implemented in a single integrated circuit die. In other embodiments, the circuit 508 is implemented in more than one integrated circuit die of an integrated circuit device which may include a multi-chip package containing the integrated circuit.

In various embodiments, the decoder 510 is implemented in an integrated circuit device, which may include an integrated circuit package containing the integrated circuit. In some embodiments, the decoder 510 is implemented in a single integrated circuit die. In other embodiments, the decoder 510 is implemented in more than one integrated circuit die of an integrated circuit device which may include a multi-chip package containing the integrated circuit.

In various embodiments, the circuit 516 is implemented in an integrated circuit device, which may include an integrated circuit package containing the integrated circuit. In some embodiments, the circuit 516 is implemented in a single integrated circuit die. In other embodiments, the circuit 516 is implemented in more than one integrated circuit die of an integrated circuit device which may include a multi-chip package containing the integrated circuit.

In various embodiments, the decoder 518 is implemented in an integrated circuit device, which may include an integrated circuit package containing the integrated circuit. In some embodiments, the decoder 518 is implemented in a single integrated circuit die. In other embodiments, the decoder 518 is implemented in more than one integrated circuit die of an integrated circuit device which may include a multi-chip package containing the integrated circuit.

Figure 6:
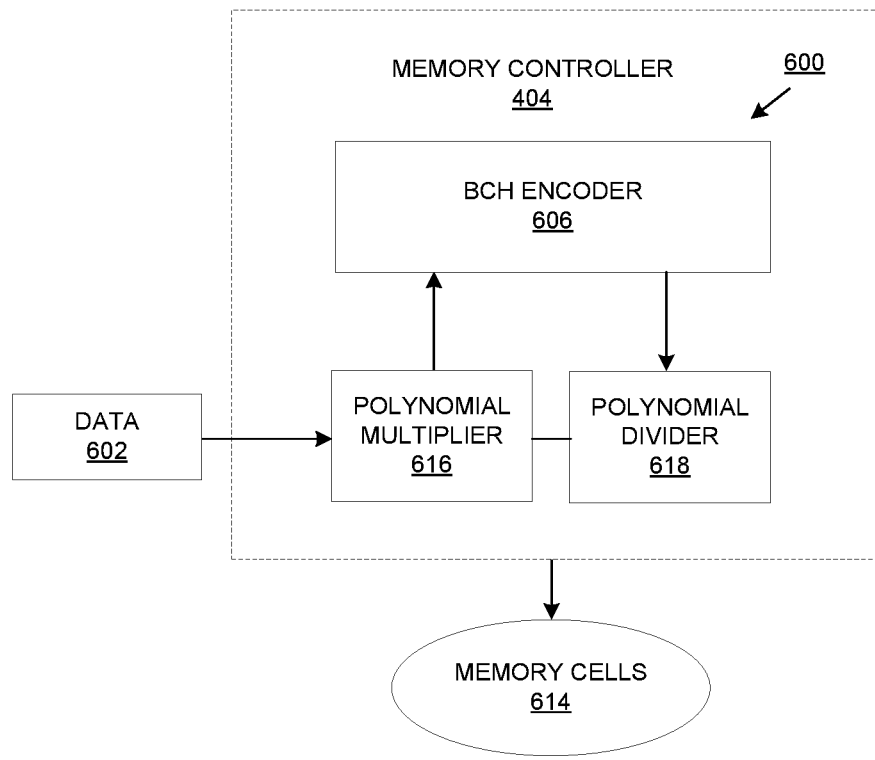
FIG. 6 illustrates a method for variable T BCH coding of data, using separate polynomial multiplier and polynomial divider circuits, in accordance with an embodiment.
Figure 7:
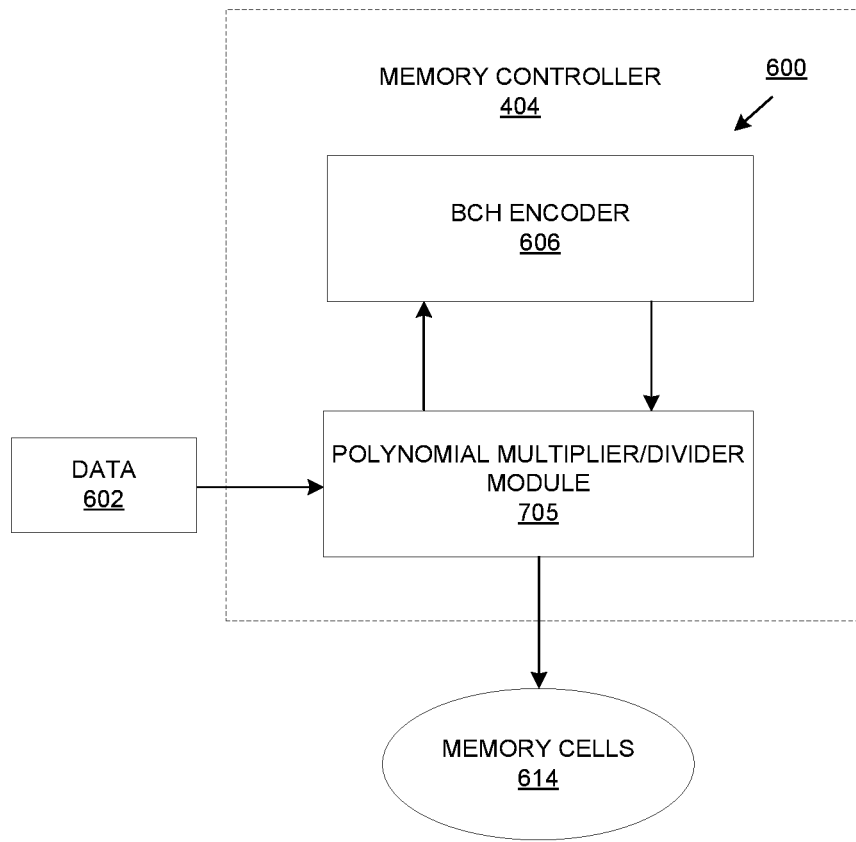
FIG. 7 illustrates a method for variable T BCH coding of data, using a polynomial multiplier/divider module, in accordance with an embodiment.

FIGS. 6 and 7 aid in illustrating the movement of data through a memory controller (described above) during the variable T BCH encoding of data (the T reduction method as will be discussed below), in accordance with an embodiment. Such a method is briefly put forth here with respect to FIGS. 6 and 7, but will be described in greater detail below. With reference to FIGS. 4, 6 and 7, a general amount of data is represented at 602, by way of message bits. The data 602 is input into the polynomial multiplier 616. Of note, in one embodiment and as shown in FIG. 6, the polynomial multiplier 616 circuit resides separate from, though communicatively with (wired and/or wirelessly), the polynomial divider 618 circuit. Yet, in another embodiment and as shown in FIG. 7, a polynomial multiplier/divider module 705 circuit is a single circuit that enables both the polynomial multiplication and polynomial division to occur thereon, though not at the same time.

The polynomial multiplier 616 (or in one embodiment, the polynomial multiplier/divider 705) performs a multiplication operation on the data 602. The product of this multiplication operation is then sent to the BCH encoder 606. The BCH encoder 606 encodes the product value, and finds its associated remainder (described below). The BCH encoder 606 next sends the remainder value back to the polynomial divider 618 (or in one embodiment, the polynomial multiplier/divider 705). The polynomial divider 618 then performs a division operation on the remainder value. The resulting quotient of the division operation is sent to the memory cells 614 of the memory chips that reside, in one embodiment, at the memory system 402.

Of note, the polynomial multiplier/divider module 705 (as well as the polynomial multiplier 616) performs a polynomial multiplication (i.e. linear feed forward shift register polynomial multiplier which performs a convolution operation over Galois Field (GF) (2)). The polynomial multiplier/divider module 705 (as well as the polynomial divider 618) performs a polynomial division (i.e. linear feedback shift register for polynomial division over GF(2)). Of note, the foregoing methods of polynomial multiplication and division operations are well known to those skilled in the art.

Embodiments of the present technology reduce the Ts, and thus XOR arrays, necessary for implementation of ECC via BCH coding, in a "T reduction" (T−1 error correcting BCH code) method, as will be described below in detail. A brief overview of the T reduction method follows, in accordance with embodiments. Following the brief overview of the T reduction method, a more detailed description is put forth with reference to FIGS. 8-12 and in accordance with embodiments.

Overview of T Reduction Method

According to an embodiment, the T reduction method achieves a T that is one less than the original T error correcting code (T minus one).

First, the value of g'(x), based on the selected BCH code, is calculated. g'(x) is the product of a multitude of $g_i(x)$s that formed the generator polynomial g(x). However, $g_t(x)$, which is the last $g_i(x)$ to be attached to the equation, is not included in the g'(x) equation. $g_t(x)$, is the last minimal polynomial that distinguishes the original T error correcting code from the derived T−1 (T minus one) error correcting code.

Using the Chinese Remainder theorem and polynomial operations over GF, those skilled in the art can show that the remainder of the polynomial representation of the input message, m(x), with respect to g'(x) can be calculated by first multiplying m(x) by $g_t(x)$ and then calculating the remainder of this multiplication by g(x) and finally dividing the resulting remainder by $g_t(x)$.

Figure 8:
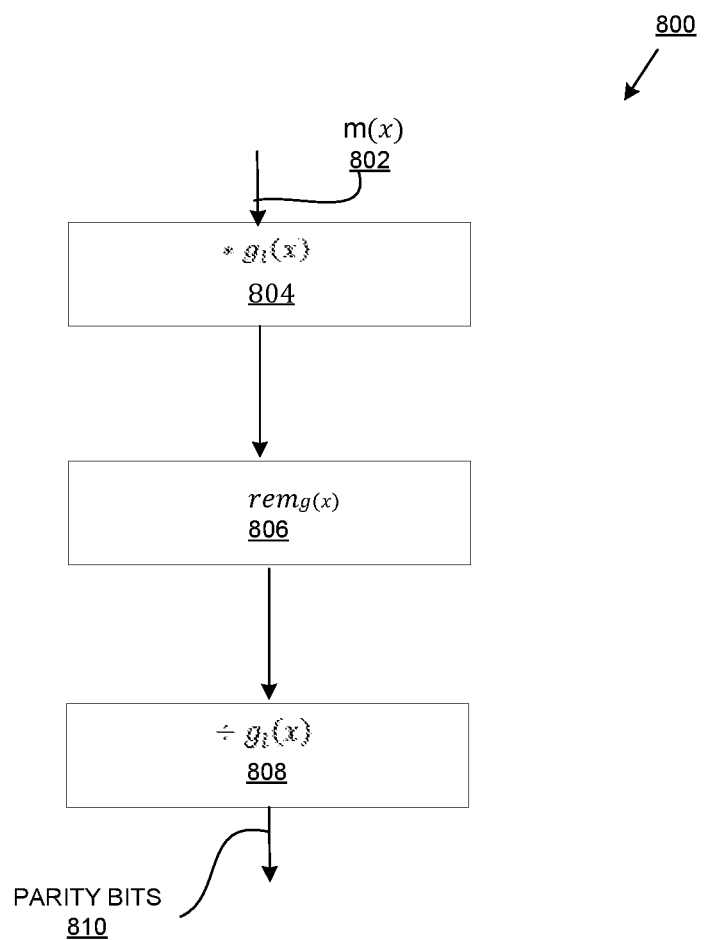
FIG. 8 illustrates a flow diagram of the variable T BCH coding process, in accordance with an embodiment.

Referring to FIG. 8, a flow diagram of the above-described overview of the variable T BCH encoding process 800 is illustrated, in accordance with an embodiment. The following example is given with reference to FIG. 8. The message (user data) bits, in the form of polynomial m(x) 802, is input to this block for which the remainder with respect to g'(x) (which constitutes the parity for the derived T−1 error correcting BCH code) is to be calculated. At step 804, m(x) is multiplied by $g_t(x)$ (which is the last $g_i(x)$ to be attached to the equation). At step 806, the remainder of this multiplication, performed at step 804, with respect to g(x) is found. Since g(x) is the generator polynomial of the base T error correcting encoder, this step is equivalent to encoding the input using the base encoder. Then, at step 808, the result of step 806 is divided by $g_t(x)$ and the quotient is output yielding parity bits 810 for the T−1 error correcting BCH.

Figure 9:
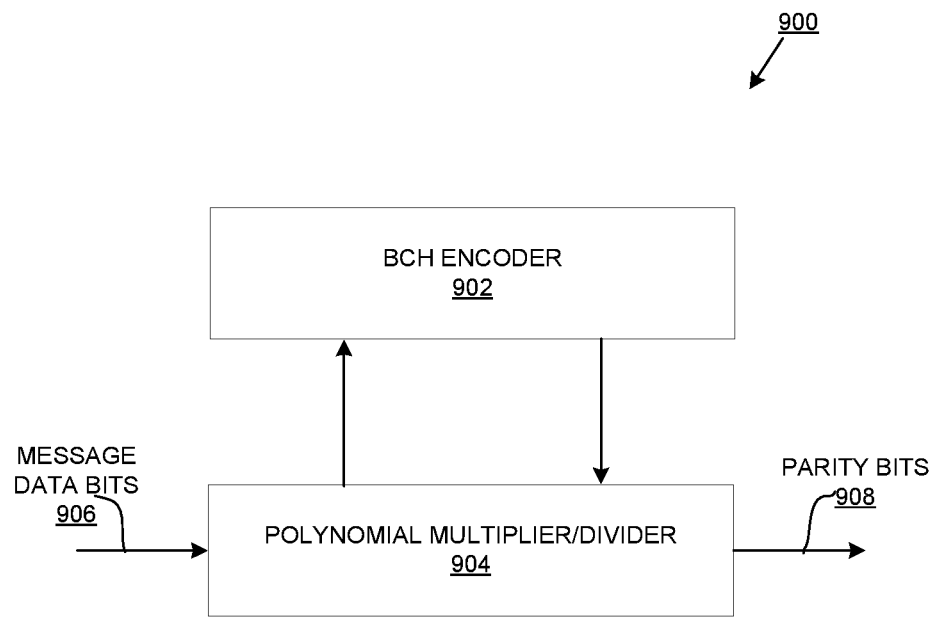
FIG. 9 illustrates a block diagram of an overview of a circuit 900 for T reduction in BCH coding, in accordance with an embodiment.

Referring to FIG. 9, a block diagram of an overview of a circuit 900 for T reduction in BCH coding is illustrated, in accordance with an embodiment. The circuit 900 includes a polynomial multiplier/divider 904 and a BCH encoder 902. Message data bits 906 (in the form of m(x)) are input into the polynomial multiplier/divider module 904 of the circuit 900. The multiplier/divider module 904 performs the multiplication operation $g_t(x)*m(x)$, where m(x) is the input message in polynomial form, and sends the resulting product to the BCH encoder 902. The BCH encoder 902, through the conventional BCH encoding steps briefly described above in the subsection "Conventional BCH Encoding Steps", determines the remainder with respect to g(x), i.e. remg(x), and then transmits the remainder, remg(x), back to the polynomial multiplier/divider module 904. The polynomial multiplier/divider module 904 then divides this remainder value by $g_t(x)$. The polynomial multiplier/divider 904 next outputs the resulting quotient as parity bits 908.

Referring now to FIGS. 8 and 9, while performing the BCH encoding, according to one embodiment, the division operation at step 808 (performed by the polynomial multiplier/divider 904) does not start until both the entire input of the message data bits 906 has been received and the product at step 804 has been calculated by the polynomial multiplier/divider 904. Thus, while the message data bits 906 are being input, only the multiplier operations at step 804 are being performed. The part of the circuitry upon which the multiplier operations are occurring may be reused by the division operations only after the multiplier operations have been completed. This is not necessarily the case during the operation of the polynomial multiplier 616 and the polynomial divider 618, residing separate from each other, though communicatively coupled therewith.

Thus far, the reduction of the T parameter by one of the native BCH codes has been discussed, in accordance with one embodiment. However, further embodiments provide for the reduction of T by more than one. FIG. 10 is a block diagram of an example operation 1000 illustrating the reduction of T by two, in accordance with an embodiment. The contrast between FIGS. 8 and 10 will next be discussed.

As previously noted, FIG. 8 illustrates the reduction of T by one, and accordingly, m(x) is multiplied by just $g_t(x)$. At step 1001, message bits in the form of m(x) are input. Next, in contrast to FIG. 8 and the T−1 reduction described therein, FIG. 10 shows that at step 1002, the m(x) input at step 1001 is multiplied by $g_t(x)g_{t-1}(x)$, wherein the multiplier "$g_{l-1}(x)$" is used to account for the extra T reduction involved (i.e. for a T reduction by two, we define ΔT=2 and T"=T−ΔT, for a T reduction by three where ΔT=3, then T'''=T−ΔT). The extra multiplication, $x^{N-\tilde{K}}$ (i.e. shifting the data by zero padding), at step 1004, functions to align the data correctly with the boundaries of the base T error correcting BCH code. Here, $\tilde{K}=K+\Delta T*m$ (the ΔT, as described above, represents the change in T implemented by the T reduction method) is the new value for the number of data bits after reducing T by ΔT=2. At step 1006, the remainder of 1004's output with respect to g(x) is found by a BCH encoder (such as the BCH encoder 902). At step 1008, the output of 1006 is then divided by $g_l(x)g_{l-1}(x)$, yielding the parity bits 1010 (for the T−2 error correcting BCH).

FIG. 11 is a block diagram of an example operation over a circuit 1100 illustrating the arbitrary reduction of T by more than two, in accordance with an embodiment. For example, assume that T can be reduced by up to four and thus e=4, where "e" is a user-selected integer that is the maximum number of T reductions that is being facilitated. However, it should be noted that the ellipses shown in FIG. 11 represent the concept that embodiments described herein may have a selected e that is greater than four, with the circuit (and data blocks and Muxes therein) adjusted accordingly.

With reference now to FIGS. 9 and 11, message bits 1102 are input into the circuit 1100. If T is to be reduced by e=4, the input message (message bits 1102) will enter data block 1104. However, if T is to be reduced by e=3, the input message (message bits 1102) will enter the Mux 1108 first, and then be directed to the data block 1110. Multiplexers 1108, 1114, 1120 and 1126 facilitate such data transfer for T reductions of e=4, 3, 2, 1 and 0.

Assuming the T reduction of e=4 is to be processed, the polynomial multiplier/divider 904, at data block 1104, multiplies the input message m(x) by $g_{l-e+1}(x)$. $g_{l-e+1}(x)$ is the $e^{th}$ ($4^{th}$ when e=4) minimal polynomial which was omitted from the generator polynomial of the base BCH code g(x) in the process of the T reduction. (Recall, as described above, that g'(x) is the product of a multitude of $g_i(x)$s that formed the generator polynomial g(x). However, $g_l(x)$, which is the last $g_i(x)$ to be attached to the equation, is not included [omitted] in the g'(x) equation. Thus, in this example, $g_l(x)$, is the last minimal polynomial that distinguishes the original T error correcting code from the derived T−4[T minus four] error correcting code.)

At step 1106, the Mux 1108 selects and passes the results of the multiplication operation performed at the data block 1104 to the data block 1110. At the data block 1110, the polynomial multiplier/divider 904 multiplies the results of the multiplication operation performed at the data block 1104 by $g_{l-e+2}(x)$. Of note, $g_{l-e+2}(x)$ is the $(e-1)^{th}$ ($3^{rd}$ when e=4) minimal polynomial which was omitted from the generator polynomial of the base BCH code g(x). However, if T is to be reduced by e=3, the input message (message bits 1102), that entered the Mux 1108 first and then were directed to the data block 1110, are multiplied by the polynomial multiplier/divider 904 by a $g_{l-e+2}(x)$.

At step 1112, if the T is to be reduced by e=4 or e=3, then the Mux 1114 selects and passes the results of the multiplication operation performed at the data block 1110 to the data block 1116. At the data block 1116, the polynomial multiplier/divider 904 multiplies the results of the multiplication operation performed at the data block 1110 by $g_{l-e+3}(X)$. Of note, $g_{l-e+3}(X)$ is the $(e-2)^{th}$ ($2^{nd}$ when e=4) minimal polynomial which was omitted from the generator polynomial of the base BCH code g(x). However, if T is to be reduced by e=2, the message bits 1102 will enter the Mux 1114 first, and then be directed to the data block 1116; the message bits 1102, that entered the Mux 1114 first and then were directed to the data block 1116, are multiplied by the polynomial multiplier/divider 904 by $g_{l-e+3}(x)$.

At step 1118, if the T is to be reduced by e=4, e=3 or e=2, then the Mux 1120 selects and passes the results of the multiplication operation performed at the data block 1116 to the data block 1122. At the data block 1122, the polynomial multiplier/divider 904 multiplies the results of the multiplication operation performed at the data block 1116 by $g_l(x)$, the last term in the resulting polynomial $g_l(x)$. However, if T is to be reduced by e=1, the message bits 1102 will enter the Mux 1120 first, and then be directed to the data block 1122; the message bits 1102, that entered the Mux 1120 first and then were directed to the data block 1122, are multiplied by the polynomial multiplier/divider 904 by $g_l(x)$.

At step 1124, if the T is to be reduced by e=4, e=3, e=2, or e=1, then the Mux 1126 selects and passes the results of the multiplication operation performed at the data block 1122 a shifter/zero padding block 1128. (Of note, when no T reduction is selected, the Mux 1126 selects and passes the message bits 1102 directly to the shifter/zero padding block 1128.) At the shifter/zero padding block 1128, the data that was passed thereto by the Mux 1126 is multiplied by $x^{N-\tilde{K}}$ (i.e. shifting the data by zero padding) to align the data correctly with the boundaries of the base T error correcting BCH code. Here $\tilde{K}=K+\Delta T*m$ (as described herein, the ΔT is the change in the T implemented by the T reduction method) is the new value for the number of message bits after reducing T. After the multiplication operation has been performed by the shifter/zero padding 1128, the resulting number value of the multiplication operation is sent to the base BCH encoder 1130, at which the remainder over the base generator polynomial g(x) is calculated.

Still referring to FIGS. 9 and 11, and continuing with the example in which e=4, and thus T can be reduced by up to four, at data block 1132, the polynomial multiplier/divider 904 divides the output of the BCH encoder 1130 by $g_{l-e+1}(x)$ if the T reduction of e=4 was selected. Otherwise, the BCH encoder 1130 output will be forwarded to one of the next data blocks 1138, 1144, or 1150 for division operations by one of the upcoming Muxes 1136, 1142, 1148, or 1154.

At step 1134, if the T reduction of e=4 was selected, the Mux 1136 will select and pass the quotient of the previous division operation performed at the data block 1132 to the data block 1138. However, if the T reduction of e=3 was selected, the output of the BCH Encoder 1130 will be directed directly to the Mux 1136, which will in turn, pass the output to the data block 1138. At the data block 1138, the polynomial multiplier/divider 904 divides the output, that was directed to the data block 1138 by the Mux 1136, by $g_{l-e+2}(x)$.

At step 1140, if the T reduction of e=4 or e=3 was selected, the Mux 1142 will select and pass the quotient of the previous division operation performed at the data block 1138 to the data block 1144. However, if the T reduction of e=2 was selected, the output of the BCH Encoder 1130 will be directed to the Mux 1142, which will in turn, pass the output to the data block 1144. At the data block 1144, the polynomial multiplier/divider 904 divides the output, that was directed to the data block 1144 by the Mux 1142, by $g_{l-e+3}(x)$.

At step 1146, if the T reduction of e=4, e=3, or e=2 was selected, the Mux 1148 selects and passes the quotient of the previous division operation performed at the data block 1144 to the data block 1150. However, if the T reduction of e=1 was selected, the output of the BCH Encoder 1130 will be directed to the Mux 1148, which in turn will pass the output to the data block 1150. At the data block 1150, the polynomial multiplier/divider 904 divides the output, that was directed to the data block 1150 by the Mux 1148, by $g_l(x)$.

At step 1152, if the T reduction of e=4, e=3, e=2, or e=1 was selected, the Mux 1154 selects and passes the quotient of the previous division operation performed at the data block 1150 to the output 1158 as parity bits. However, if no T reduction was selected, the output of the BCH Encoder 1130 will be directly sent to the Mux 1154, which will in turn pass the output of the BCH Encoder 1130 to the output 1158.

As described, if the user selects not to reduce T, the operation, according to an embodiment, will begin at the very bottom Mux, which in this example is Mux 1126, and the message bits 1102 will not be disturbed by any of the polynomial multipliers. The Mux 1154 will receive the output of the BCH Encoder 1130 and will send this output to the output 1158 as parity bits without any disturbance from the polynomial dividers.

For T reduction to occur, the following information is given: the generator polynomial g(x) for the base T error correcting BCH code; the minimal polynomials $g_i(x)$, i= 1 . . . l, from which the generator polynomial is constructed (i.e. $g(x)=f\Pi_{i=1}^{l}g_i(x)$. Additionally, the minimal polynomials are sorted in ascending order such that $g_l(x)$ is the difference between the generator polynomial of the T error correction code g(x) and that of the T−1 error correcting code g'(x). Similarly, the generator polynomial for the T−2 error correcting BCH code, g"(x) misses the last two minimal polynomials $g_l(x)$ and $g_{l-1}(x)$, and so on. The difference polynomial between the base T error correcting polynomial and that of the T−ΔT error correcting polynomial is hence given as $f_{\Delta T}(x)=\Pi_{j=0}^{\Delta T-1}g_{l-j}(x)$.

FIG. 12 illustrates a block diagram showing a variable T reduction method 1200 wherein T=3, and the use of multiple BCH encoders that support different ranges of T values, according to an embodiment. As can be seen, FIG. 12 shows two BCH encoders 1202A and 1202B (hereinafter, "1202", unless specifically noted otherwise), each having its own polynomial multiplier/divider. For example, BCH encoder 1202A is connected to a polynomial multiplier/divider which performs the multiplier operations 1206A, 1206B and 1206C as well as the divider operations 1206D, 1206E and 1206B (hereinafter, "operations 1206", unless specifically noted otherwise). Likewise, the BCH encoder 1202B is connected to a polynomial multiplier/divider which performs the multiplier operations 1208A, 1208B and 1208C as well as the divider operations 1208D, 1208E and 1208F (hereinafter, "operations 1208", unless specifically noted otherwise). The output of the multiplier and divider operations of both the operations 1206 and operations 1208 pass through the Muxes A, B, C, D, E and F. Zero padding modules 1204A and 1204B (hereinafter, "1204" unless specifically noted otherwise) are placed before the BCH encoders 1202 such that the process of zero padding occurs before the BCH encoders 1202 operate.

In this example embodiment, the first BCH encoder 1202A supports any T value greater than or equal to ninety-six and less than or equal to one hundred and twenty-eight. The second BCH encoder 1202B supports any T value greater than or equal to sixty-four and less than ninety-six. In one instance, if the user selects T to be one hundred and twenty-six, then embodiments will use the BCH encoder 1202A that supports any T value greater than or equal to ninety-six and less than or equal to one hundred and twenty-eight. There will be two reductions resulting in this T selection and the use of the BCH encoder 1202A, since one hundred and twenty-eight (the maximum supported T value) minus one hundred and twenty-six (the T value selected) is equal to two (i.e. 128−126=2). In another instance, if the user selects T as ninety-eight, then embodiments will also use the BCH encoder 1202A that supports any T value greater than or equal to ninety-six and less than or equal to one hundred and twenty-eight. There will be thirty reductions made, 128−98=30.

The rationale behind creating two BCH encoders instead of one BCH encoder is that two BCH encoders supporting two different ranges of T require less implantation area than one BCH encoder supporting a large range of Ts. For example, if there was only one BCH encoder that supported any T up to one hundred and twenty-eight, then if the user selects T as seventy, fifty-eight reductions will be made (128−70=58). However, if there are two BCH encoders, with one of the BCH encoders supporting any T from sixty-four to ninety-six, then if the user selected T as seventy, only twenty-six reductions would be made (96−70=26). Each reduction requires a new set of multiplier and divider operations to occur (to account for the selected e and operations associated therewith and described herein with reference to at least to FIG. 11), which consequently increases the circuit size and its implementation area. Since twenty-six reductions are less than fifty-eight reductions, having two BCH encoders that support two different ranges of T values instead of one BCH encoder supporting all of the T values saves space. In essence, there is a tradeoff to be made between the number of physical encoders in the implementation and the number of polynomial multiplier and divider modules. To find the minimum implementation area, it may be necessary to incorporate two physical encoders and reduce the number of polynomial multiplier and divider modules by two.

Additionally, of note, the greater the number of different Ts that must be supported, the more gates that are required. Additionally, after the polynomial multiplier/dividers have performed and before parity begins, a parity delay occurs. In one example instance, 100 clock cycles of parity delay may occur. When or if more reductions occur, according to embodiments, more clock cycles of delay will also occur.

Embodiments of the present invention provide a system and method to reuse BCH encoders by presenting polynomial multiplier and polynomial divider functions before and after the BCH encoder performs its operations. Such methods and systems support a variable number of T settings within a high speed BCH encoder. Such methods and systems enable greater error correction capacity than standard T sharing approaches, while reducing implementation area and increasing power efficiency. Such embodiments are desirable for flash memory applications to provide full rate flexibility.

With reference now to FIG. 13 and in accordance with an embodiment, a block diagram of a system 1300 for implementing variable T BCH encoders is shown. The system 1300, in one embodiment, includes: a polynomial multiplier 1320; a shifter/zero padder 1330; a BCH encoder 1340; and a polynomial divider 1350. In optional embodiments, the system 1300 further includes any of the following: a receiver 1310; a memory storage area 1360; and a parity output module 1360. Additionally, in one embodiment, and as described herein, the polynomial multiplier 1320 and the polynomial divider 1350 may both reside on a polynomial multiplier/divider module, as is described herein.

In one embodiment, the receiver 1310 receives the message polynomial 1305. In one embodiment and as described herein above, the polynomial multiplier 1320 accesses the message polynomial 1305, and generates a first value 1325 by multiplying the message polynomial 1315 by the difference polynomial.

In one embodiment and as already described herein, the shifter/zero padder 1330 accesses the first value 1325, in one embodiment and as already described herein, and calculates a second value 1335 by multiplying the first value 1325 by $x^{N-\tilde{K}}$. The shifter/zero padder 1330 then passes the calculated second value 1335 to the BCH encoder 1340.

In one embodiment, the BCH encoder 1340 generates a third value 1345 by dividing the second value 1335 by the generator polynomial of the T error correcting BCH code g (x), and calculating the remainder based on the division. The BCH encoder 1340 then passes the third value 1345 to the polynomial divider 1350.

In one embodiment and as is already described herein, the polynomial divider 1350 calculates a fourth value 1355 by dividing the third value 1345 by the difference polynomial. The fourth value 1355 includes the parity of the T–ΔT error correcting BCH code. (Of note, the fourth value 1355 also includes the original raw data from the user as well as the generated m*(T–ΔT) parity bits.) The polynomial divider 1350 then passes the fourth value 1355, wherein the fourth value 1355 includes the parity of the T–ΔT error correcting BCH code; in one embodiment, the fourth value 1355 is passed to the parity output module 1360, which then outputs the fourth value 1355 from the system 1300.

Of note, the BCH encoder 1340, in one embodiment, is communicatively (wired and/or wirelessly) with the polynomial multiplier 1320, the shifter/zero padder 1330 and the polynomial divider 1350.

Of note, while in one embodiment, the memory storage area 1360 resides on the memory system 1305, in another embodiment, the memory storage area 1360 resides external to, but communicatively (wired and/or wirelessly) coupled with the memory system 1305.

Figure 14A:
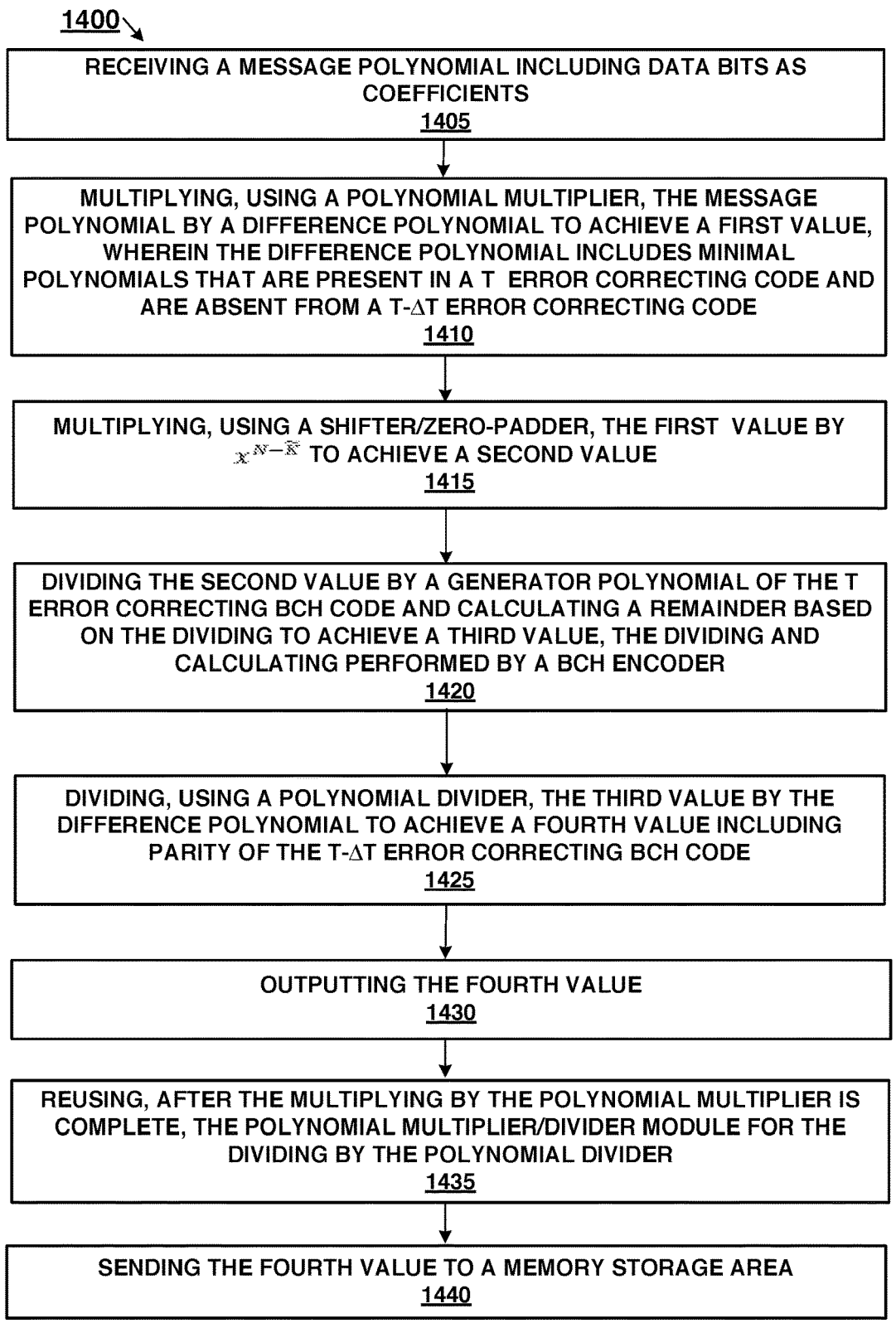
FIG. 14A illustrates a flow diagram of a method for encoding a variable T BCH, in accordance with an embodiment.
Figure 15:
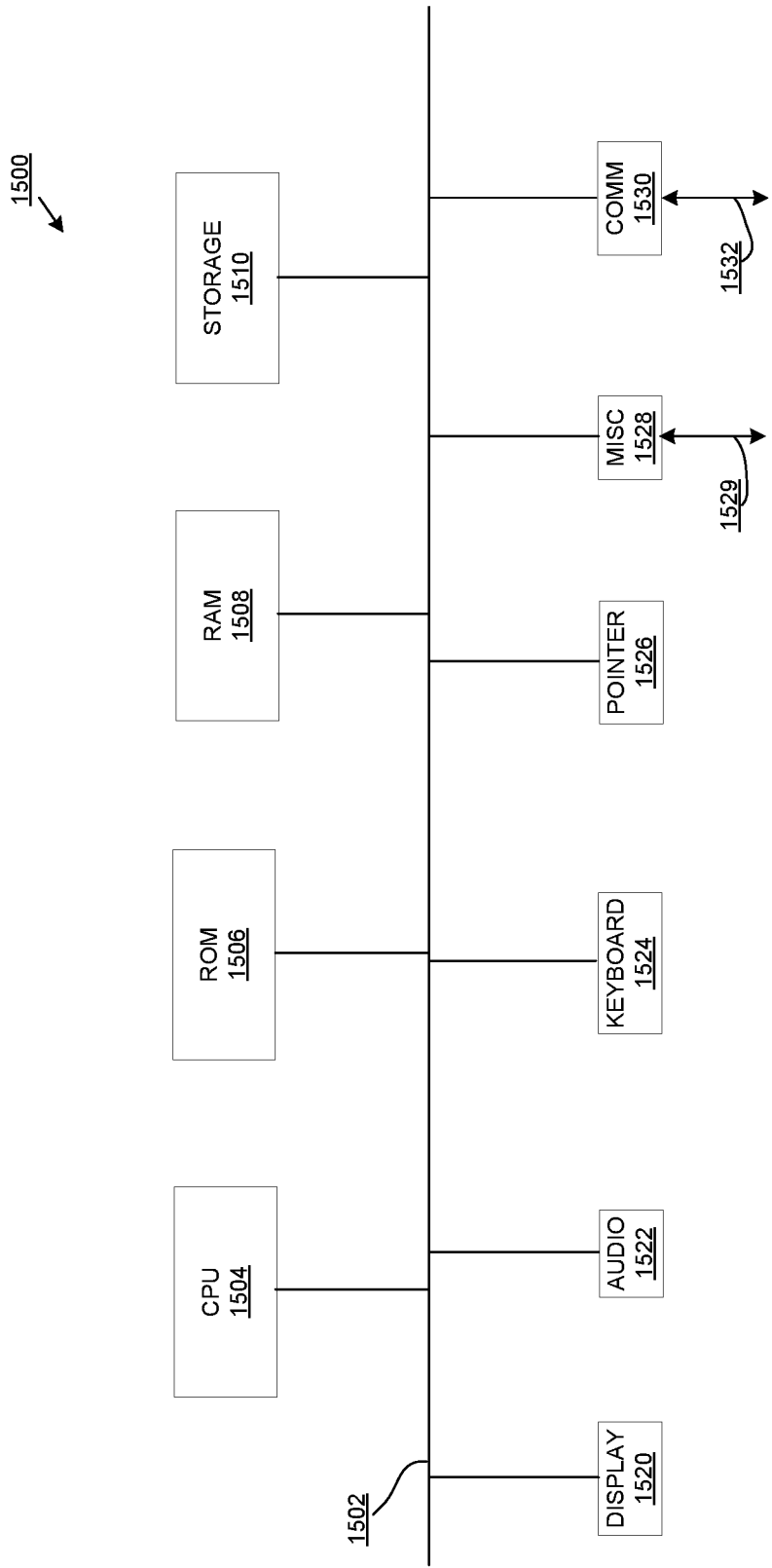
FIG. 15 illustrates a block diagram of a computer system (data processing device such as a computer, smart phone, tablet computer, etc.) in which embodiments of the invention may be used.

With reference to FIGS. 14A and 14B, flow diagrams 1400 and 1450 illustrate example procedures used by various embodiments. Flow diagrams 1400 and 1450 include processes and operations that, in one or more embodiments, are carried out by one or more processors (e.g., CPU(s) 1504 of FIG. 15) under the control of computer-readable and computer-executable instructions. The computer-readable and computer-executable instructions reside, for example, in tangible data storage features such as memory ROM 1506 and RAM 1508 and/or a data storage unit 1510. The computer-readable and computer-executable instructions, which may reside on computer readable media, are used to control or operate in conjunction with, for example, one or more components of the memory system 402 and/or one or more processors 1504.

Although specific procedures are disclosed in flow diagrams 1400 and 1450, such procedures are examples. That is, embodiments are well suited to performing various other operations or variations of the operations recited in the processes of flow diagrams 1400 and 1450. Likewise, in some embodiments, the operations in flow diagrams 1400 and 1450 may be performed in an order different than presented, not all of the operations described in one or more of this flow diagram may be performed, and/or one or more additional operations may be added.

FIG. 14A shows a flow diagram of an example method 1400 for implementing variable T BCH encoders, in accordance with an embodiment. Example embodiments of methods 1100 and 1200 of FIGS. 11 and 12, respectively, operate according to and are more detailed operative descriptions of the method 1400 described with respect to FIG. 14A.

At operation 1405, in one embodiment and as described herein, a message polynomial is received, wherein the message polynomial includes data bits as coefficients. The T reduction amount ΔT is also received.

At operation 1410, in one embodiment and as described herein, a polynomial multiplier (such as polynomial multiplier 1320 of FIG. 13) multiplies the message polynomial by a difference polynomial ($f_{\Delta T}(x)$), wherein the difference polynomial includes minimal polynomials that are present in a T error correcting BCH code and are absent from a T–ΔT error correcting code. The result of such a multiplication operation is the first value 1325.

At operation 1415, in one embodiment and as described herein, a shifter/zero-padder (such as shifter/zero-padder 1330 of FIG. 13) multiplies the first value by $x^{N-\tilde{K}}$ (where $\tilde{K}=K+\Delta T*m$). The result of such multiplication is the second value, such as the second value 1335.

At operation 1420, in one embodiment and as described herein, the BCH encoder (such as BCH encoder 1340 of FIG. 13) divides the second value by a generator polynomial of the T error correcting BCH code (g(x)) and calculates a remainder based on the dividing. The result of such calculations performed by the BCH encoder is the third value, such as the third value 1345. Such calculations may be performed using a method of BCH encoding, such as, for example, the encoding method 1100.

At operation 1425, in one embodiment and as described herein, a polynomial divider (such as the polynomial divider 1350 of FIG. 13) divides the third value by the difference polynomial ($f_{\Delta T}(x)$) to achieve the fourth value, such as the fourth value 1355.

At operation 1430, in one embodiment and as described herein, the fourth value is output. (The fourth value is output as the parity of the T–ΔT error correcting BCH code.) In one embodiment, for example, this fourth value is output from a memory system, such as memory system 1305 of FIG. 13. In another embodiment, at operation 1440, the fourth value is sent to a memory storage area (such as memory storage area 1360 of FIG. 13).

At operation 1435, in one embodiment and as described herein, a polynomial multiplier/divider module (such as the polynomial multiplier/divider 705 of FIG. 7) is reused by a polynomial divider (such as polynomial divider 1350 of FIG. 13) for dividing after the multiplying is performed by the polynomial multiplier (such as the polynomial multiplier 1320 of FIG. 13) is complete.

FIG. 14B shows a flow diagram of an example method 1450 for reducing circuit implementation area during BCH coding, in accordance with an embodiment. Example embodiments of methods 1100 and 1200 of FIGS. 11 and 12, respectively, operate according to and are more detailed operative descriptions of the method 1450 described with respect to FIG. 14B.

At operation 1455, in one embodiment and as described herein, a message polynomial is received, wherein the message polynomial includes data bits as coefficients.

At operation 1460, in one embodiment and as described herein, a selected T reduction parameter value is received, wherein the selected T reduction parameter value is the maximum number of T reductions that are to be applied to an original T error correcting code value during the BCH coding to achieve a reduced number value of Ts, such that the reduced number value of Ts that is less than the original T error correcting BCH code value is used for the BCH coding.

At operation 1465, in one embodiment and as described herein, based on the selected T reduction parameter value as compared to the original T error correcting code value, multiplier operations are applied, encoding operations are applied and divider operations are applied to the message polynomial to achieve an output, wherein the output includes parity bits.

In one embodiment, the multiplying operations of step 1465 include multiplying the message polynomial by a difference polynomial to achieve a first value, wherein the difference polynomial includes minimal polynomials that are present in the original T error correcting BCH code and are absent from a T–ΔT error correcting BCH code.

In one embodiment, the encoding operation at step 1465 include multiplying a result of the multiplying operations by $x^{N-\tilde{K}}$ to achieve an encoding multiplying value, dividing the encoding multiplying value by a generator polynomial of the T error correcting BCH code and calculating a remainder based on the dividing to achieve an encoding remainder value.

In one embodiment, the divider operations of step 1465 include dividing a result of the encoding operations by the difference polynomial to achieve a divider quotient value that includes parity of a T–ΔT error correcting BCH code.

In one embodiment, the multiplier operations and the divider operations of step 1465 occur at separate times.

FIG. 15 illustrates a block diagram of an embodiment of a host processor, which can be referred to as a computer system (data processing device such as a computer, smart phone, tablet computer, etc.) in which some embodiments of the invention may be used. The block diagram is a high level conceptual representation and may be implemented in a variety of ways and by various architectures. Bus system 1502 interconnects a Central Processing Unit (CPU) 1504, Read Only Memory (ROM) 1506, Random Access Memory (RAM) 1608, storage 1510, display 1520, audio, 1522, keyboard 1524, pointer 1526, miscellaneous input/output (I/O) devices 1528, and communications module 1530. The bus system 1502 may be for example, one or more of such buses as a system bus, peripheral Component Interconnect (PCI), Advanced Graphics Port (AGP), Small Computer system interface (SCSI), Institute of Electrical and Electronics Engineers (IEEE) standard number 1694 (FireWire), Universal Serial Bus (USB), etc. The CPU 1504 may be a single, multiple, or even a distributed computing resource. Storage 1510 may be Compact Disc (CD), Digital Versatile Disk (DVD), hard disks (HD), solid state disk (SSD), optical disks, tape, flash, memory sticks, video recorders, etc. Storage 1510 or RAM 1508 might be, for example, an embodiment of the present invention. Note that depending upon the actual implementation of a computer system, the computer system may include some, all, more, or a rearrangement of components in the block diagram. Thus, many variations on the system of FIG. 15 are possible.

Connection with a network is obtained through communications channel 1532 via communications module 1530, as is recognized by those of skill in the art, which enables the data processing device 1500 to communicate with devices in remote locations. Communications channel 1532 and communications module 1530 flexibly represent communication elements in various implementations, and can represent various forms of telemetry, GPRS, Internet, and combinations thereof.

In various embodiments, a pointing device such as a stylus is used in conjunction with a touch screen, for example, via channel 1529 and miscellaneous I/O 1528.

For purposes of discussing and understanding the embodiments of the invention, it is to be understood that various terms are used by those knowledgeable in the art to describe techniques and approaches. Furthermore, in the description, for purposes of explanation, numerous specific details are set forth in order to provide a thorough understanding of the present invention. It will be evident, however, to one of ordinary skill in the art that the present invention may be practiced without these specific details. In some instances, well-known structures and devices are shown in block diagram form, rather than in detail, in order to avoid obscuring the present invention. These embodiments are described in sufficient detail to enable those of ordinary skill in the art to practice the invention, and it is to be understood that other embodiments may be utilized and that logical, mechanical, electrical, and other changes may be made without departing from the scope of the present invention.

Some portions of the description may be presented in terms of algorithms and symbolic representations of operations on, for example, data bits within a computer memory. These algorithmic descriptions and representations are the means used by those of ordinary skill in the data processing arts to most effectively convey the substance of their work to others of ordinary skill in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion, it is appreciated that throughout the description, discussions utilizing terms such as "processing", "computing", "calculating", "determining", "displaying", "generating", "multiplying", "receiving", "sending", "outputting", "reusing", "accessing", "performing", "storing", "updating", "dividing", "applying" or the like, can refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

An apparatus for performing the operations herein can implement the present invention. This apparatus may be specially constructed for the required purposes, or it may comprise a general-purpose computer, selectively activated or reconfigured by a computer program stored in the computer. Such a computer program may be stored in a computer readable storage medium, such as, but not limited to, any type of disk including floppy disks, hard disks, optical disks, compact disk-read only memories (CD-ROMs), and magnetic-optical disks, read-only memories (ROMs), random access memories (RAMs), electrically programmable read-only memories (EPROM)s, electrically erasable programmable read-only memories (EEPROMs), FLASH memories, magnetic or optical cards, etc., or any type of media suitable for storing electronic instructions either local to the computer or remote to the computer.

The algorithms and displays presented herein are not inherently related to any particular computer or other apparatus. Various general-purpose systems may be used with programs in accordance with the teachings herein, or it may prove convenient to construct more specialized apparatus to perform the required method. For example, any of the methods according to the present invention can be implemented in hard-wired circuitry, by programming a general-purpose processor, or by any combination of hardware and software. One of ordinary skill in the art will immediately appreciate that the invention can be practiced with computer system configurations other than those described, including hand-held devices, multiprocessor systems, microprocessor-based or programmable consumer electronics, digital signal processing (DSP) devices, set top boxes, network PCs, minicomputers, mainframe computers, and the like. The invention can also be practiced in distributed computing environments where tasks are performed by remote processing devices that are linked through a communications network.

The methods herein may be implemented using computer software. If written in a programming language conforming to a recognized standard, sequences of instructions designed to implement the methods can be compiled for execution on a variety of hardware platforms and for interface to a variety of operating systems. In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, application, driver), as taking an action or causing a result. Such expressions are merely a shorthand way of saying that execution of the software by a computer causes the processor of the computer to perform an action or produce a result.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, or mathematical expression. Thus, one of ordinary skill in the art would recognize a block denoting A+B=C as an additive function whose implementation in hardware and/or software would take two inputs (A and B) and produce a summation output (C). Likewise, one of ordinary skill in the art would recognize the implementation in hardware and/or software of a block denoting polynomial multiplication (A*B=C) and polynomial division (A/B=D) would take at least two inputs (A and B) and produce the product output (C) or the quotient output (D), respectively. Thus, the use of formula, algorithm, or mathematical expression as descriptions is to be understood as having a physical embodiment in at least hardware and/or software (such as a computer system in which the techniques of the present invention may be practiced as well as implemented as an embodiment).

A machine-readable medium is understood to include any mechanism for storing or transmitting information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

Various example embodiments are thus described. All statements herein reciting principles, aspects, and embodiments of the invention as well as specific examples thereof, are intended to encompass both structural and functional equivalents thereof. Additionally, it is intended that such equivalents include both currently known equivalents and equivalents developed in the future, i.e., any elements developed that perform the same function, regardless of structure. The scope, therefore, is not intended to be limited to the embodiments shown and described herein. Rather, the scope and spirit is embodied by the appended claims.

What is claimed is:

1. A method comprising:
   receiving a message polynomial comprising data bits as coefficients;
   multiplying, using a polynomial multiplier/divider module, said message polynomial by a difference polynomial to achieve a first value, wherein said difference polynomial comprises minimal polynomials that are present in a T error correcting BCH code and are absent from a T–ΔT error correcting BCH code;
   multiplying, using a shifter/zero-padder, said first value by $x^{N-K}$ to achieve a second value;
   dividing said second value by a generator polynomial of said T error correcting BCH code and calculating a remainder based on said dividing to achieve a third value, said dividing and calculating performed by a BCH encoder circuit;
   dividing, using said polynomial multiplier/divider module, said third value by said difference polynomial to achieve a fourth value comprising parity of said T–ΔT error correcting BCH code, the dividing of said third by value by said difference polynomial performed after said multiplying by said multiplier/divider module is complete; and
   outputting from said memory controller said fourth value.

2. The method of claim 1, wherein said outputting said fourth value further comprises sending said fourth value to a memory storage area.

3. The method of claim 1, wherein said outputting said fourth value further comprises sending said fourth value to a memory chip that is coupled to said memory controller, the method further comprising storing said fourth value in memory cells of said memory chip.

4. The method of claim 1 wherein the polynomial multiplier/divider module further comprises a circuit for operation as a linear feed forward shift register and for operation as a linear feedback shift register.

5. The method of claim 1, wherein ΔT is one.

6. The method of claim 1, wherein ΔT is more than one.

7. A system comprising:
a polynomial multiplier/divider module for multiplying a message polynomial by a difference polynomial to achieve a first value, wherein said message polynomial comprises user data bits as coefficients and said difference polynomial comprises minimal polynomials that are present in a T error correcting code and are absent from a T−ΔT error correcting BCH code;
a shifter/zero-padder coupled with said polynomial multiplier/divider module, said shifter/zero-padder for multiplying said first value by $x^{N-\tilde{K}}$ to achieve a second value;
a BCH encoder circuit coupled with said shifter/zero-padder, said BCH encoder circuit for dividing said second value by a generator polynomial of said T error correcting BCH code and calculating a remainder based on said dividing to achieve a third value;
said polynomial multiplier/divider module further for dividing said third value by said difference polynomial to achieve a fourth value comprising parity of said T−ΔT error correcting BCH code after said multiplying said message polynomial by said difference polynomial; and
a parity output module for outputting said fourth value.

8. The system of claim 7, further comprising:
a receiver for receiving said message polynomial, said receiver coupled to said polynomial multiplier/divider module.

9. The system of claim 7, further comprising:
a parity output module coupled to said polynomial multiplier/divider module, said parity output module for outputting said fourth value.

10. The system of claim 7, further comprising:
a memory controller, said memory controller comprising said polynomial multiplier/divider, said shifter/zero-padder, and said BCH encoder.

11. The system of claim 10, wherein said system further comprises memory cells coupled to said memory controller, said memory cells configured to store said fourth value.

12. The system of claim 7, wherein ΔT is more than one.

13. The system of claim 7, wherein ΔT is one.

14. The system of claim 7, wherein said polynomial multiplier/divider module further comprises:
a first data block including a first polynomial multiplier/divider circuit;
a first multiplexer coupled to the output of said first polynomial multiplier/divider circuit;
a second data block coupled to the output of said first multiplexer, the second data block including a second polynomial multiplier/divider circuit; and
a second multiplexer coupled to the output of said second polynomial multiplier/divider circuit, the output of the second multiplexer coupled to said shifter/zero-padder.

15. A method comprising:
receiving a message polynomial comprising data bits as coefficients;
multiplying, using a polynomial multiplier circuit, said message polynomial by a difference polynomial to achieve a first value, wherein said difference polynomial comprises minimal polynomials that are present in a T error correcting BCH code and are absent from a T−ΔT error correcting BCH code;
multiplying, using a shifter/zero-padder, said first value by $x^{N-\tilde{K}}$ to achieve a second value;
dividing said second value by a generator polynomial of said T error correcting BCH code and calculating a remainder based on said dividing to achieve a third value, said dividing said second value and said calculating performed by a BCH encoder circuit;
dividing, using a polynomial divider circuit, said third value by said difference polynomial to achieve a fourth value comprising parity of said T−ΔT error correcting BCH code, the dividing said third value performed after said multiplying by said polynomial multiplier circuit is complete; and
outputting from said memory controller said fourth value.

16. The method of claim 15, wherein said outputting said fourth value further comprises sending said fourth value to a memory storage area.

17. The method of claim 15, wherein said outputting said fourth value further comprises sending said fourth value to a memory chip that is coupled to the memory controller, the method further comprising storing the fourth value in memory cells of the memory chip.

18. A memory controller comprising:
a polynomial multiplier circuit for multiplying a message polynomial by a difference polynomial to achieve a first value, wherein said message polynomial comprises user data bits as coefficients and said difference polynomial comprises minimal polynomials that are present in a T error correcting code and are absent from a T−ΔT error correcting BCH code;
a shifter/zero-padder circuit coupled to said polynomial multiplier circuit, said shifter/zero-padder circuit for multiplying said first value by $x^{N-\tilde{K}}$ to achieve a second value;
a BCH encoder circuit coupled with said shifter/zero-padder circuit, said BCH encoder circuit for dividing said second value by a generator polynomial of said T error correcting BCH code and calculating a remainder based on said dividing to achieve a third value;
a polynomial divider circuit coupled to said BCH encoder circuit for dividing said third value by said difference polynomial, after said multiplying said message polynomial by said difference polynomial, to achieve a fourth value comprising parity of said T−ΔT error correcting BCH code; and
a parity output module coupled to said polynomial output circuit, said parity output module for outputting said fourth value.

19. The memory controller of claim 18, wherein ΔT is one.

20. The memory controller of claim 18, wherein ΔT is more than one.

21. The memory controller of claim 18, wherein the polynomial multiplier comprises a linear feed forward shift register.

22. The memory controller of claim 18, wherein the polynomial divider comprises a linear feedback shift register.

23. The memory controller of claim 18, further comprising a receiver for receiving said message polynomial, said receiver coupled to said polynomial multiplier circuit.

24. The memory controller of claim 18,
wherein said polynomial multiplier circuit comprises:
a first polynomial multiplier;
a first multiplexer coupled to the output of said first polynomial multiplier;
a second polynomial multiplier coupled to the output of said first multiplexer; and a second multiplexer coupled to the output of said second polynomial multiplier, the output of said second multiplexer coupled to said shifter/zero-padder; and wherein said polynomial divider circuit comprises:
a first polynomial divider;
a third multiplexer coupled to the output of said first polynomial divider;
a second polynomial divider coupled to the output of said third multiplexer; and
a fourth multiplexer coupled to the output of said second polynomial divider, the output of the fourth multiplexer coupled to said parity output module.

25. The memory controller of claim 24, wherein said BCH encoder circuit comprises a first BCH encoder and a second BCH encoder and wherein said shifter/zero-padder circuit comprises a first a shifter/zero-padder and a second shifter/zero-padder, the output of said first shifter/zero-padder coupled to said first BCH encoder, and the output of said second shifter/zero-padder coupled to said second BCH encoder.

* * * * *